United States Patent
Hirano

(10) Patent No.: US 9,911,635 B2
(45) Date of Patent: Mar. 6, 2018

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Hitachi Kokusai Electric Inc., Tokyo (JP)

(72) Inventor: Makoto Hirano, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 14/852,046

(22) Filed: Sep. 11, 2015

(65) Prior Publication Data

US 2015/0380288 A1   Dec. 31, 2015

Related U.S. Application Data

(63) Continuation of application No. PCT/JP2013/084632, filed on Dec. 25, 2013.

(30) Foreign Application Priority Data

Mar. 15, 2013  (JP) ................. 2013-053182

(51) Int. Cl.
*H01L 21/673* (2006.01)
*C23C 16/52* (2006.01)
(Continued)

(52) U.S. Cl.
CPC ........ *H01L 21/67389* (2013.01); *C23C 16/52* (2013.01); *C23C 16/54* (2013.01);
(Continued)

(58) Field of Classification Search
CPC ......... H01L 21/67389; H01L 21/67379; H01L 21/67393; H01L 21/6773; H01L 21/67775; H01L 21/67766
(Continued)

(56) References Cited

U.S. PATENT DOCUMENTS 5,332,013 A * 7/1994 Sugita ............... H01L 21/67389
141/197
6,579,052 B1   6/2003 Bonora et al.
(Continued)

FOREIGN PATENT DOCUMENTS

JP   07-066274   3/1995
JP   09-017851   1/1997
(Continued)

*Primary Examiner* — Glenn F Myers
(74) *Attorney, Agent, or Firm* — Edell, Shapiro & Finnan, LLC

(57) ABSTRACT

Provided is a substrate processing apparatus including a substrate container transfer device configured to transfer a substrate container accommodating a substrate and purge an inside of the substrate container; a purge gas supply unit installed at the substrate container transfer device and configured to supply a purge gas into the substrate container; a substrate container standby unit configured to accommodate the substrate container; a contact preventing unit installed at the substrate container standby unit and configured to prevent a contact between the purge gas supply unit and the substrate container standby unit when the substrate container is transferred to the substrate container standby unit by the substrate container transfer device; and a control unit configured to control the substrate container transfer device and the purge gas supply unit.

7 Claims, 19 Drawing Sheets

(51) Int. Cl.
*H01L 21/677* (2006.01)
*C23C 16/54* (2006.01)

(52) U.S. Cl.
CPC .. *H01L 21/67379* (2013.01); *H01L 21/67393* (2013.01); *H01L 21/67775* (2013.01)

(58) Field of Classification Search
USPC .................................................. 414/217, 940
See application file for complete search history.

(56) References Cited

U.S. PATENT DOCUMENTS

| | | | |
|---|---|---|---|
| 2008/0156069 A1 | 7/2008 | Murata et al. | |
| 2008/0236487 A1* | 10/2008 | Hirano | H01L 21/67017 118/715 |
| 2010/0135753 A1* | 6/2010 | Natsume | H01L 21/67772 414/217.1 |
| 2014/0014229 A1* | 1/2014 | Takahara | B65B 5/00 141/129 |
| 2014/0112739 A1* | 4/2014 | Hirano | H01L 21/67017 414/217.1 |

FOREIGN PATENT DOCUMENTS

| | | |
|---|---|---|
| JP | 2001509465 | 7/2001 |
| JP | 2008159734 | 7/2008 |

\* cited by examiner

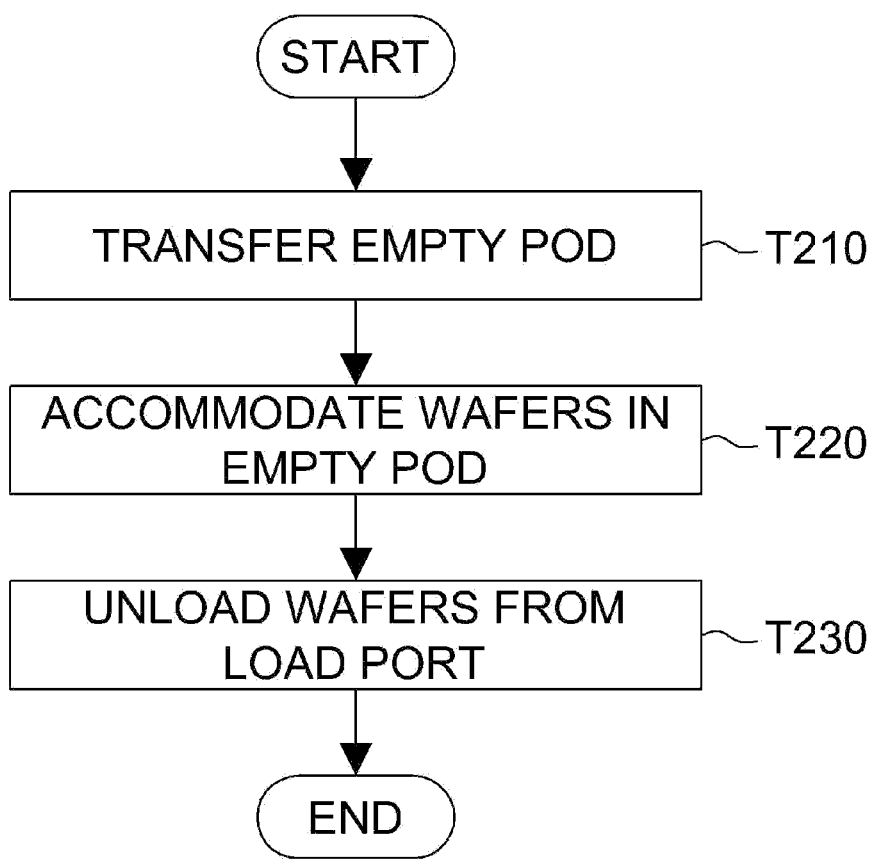

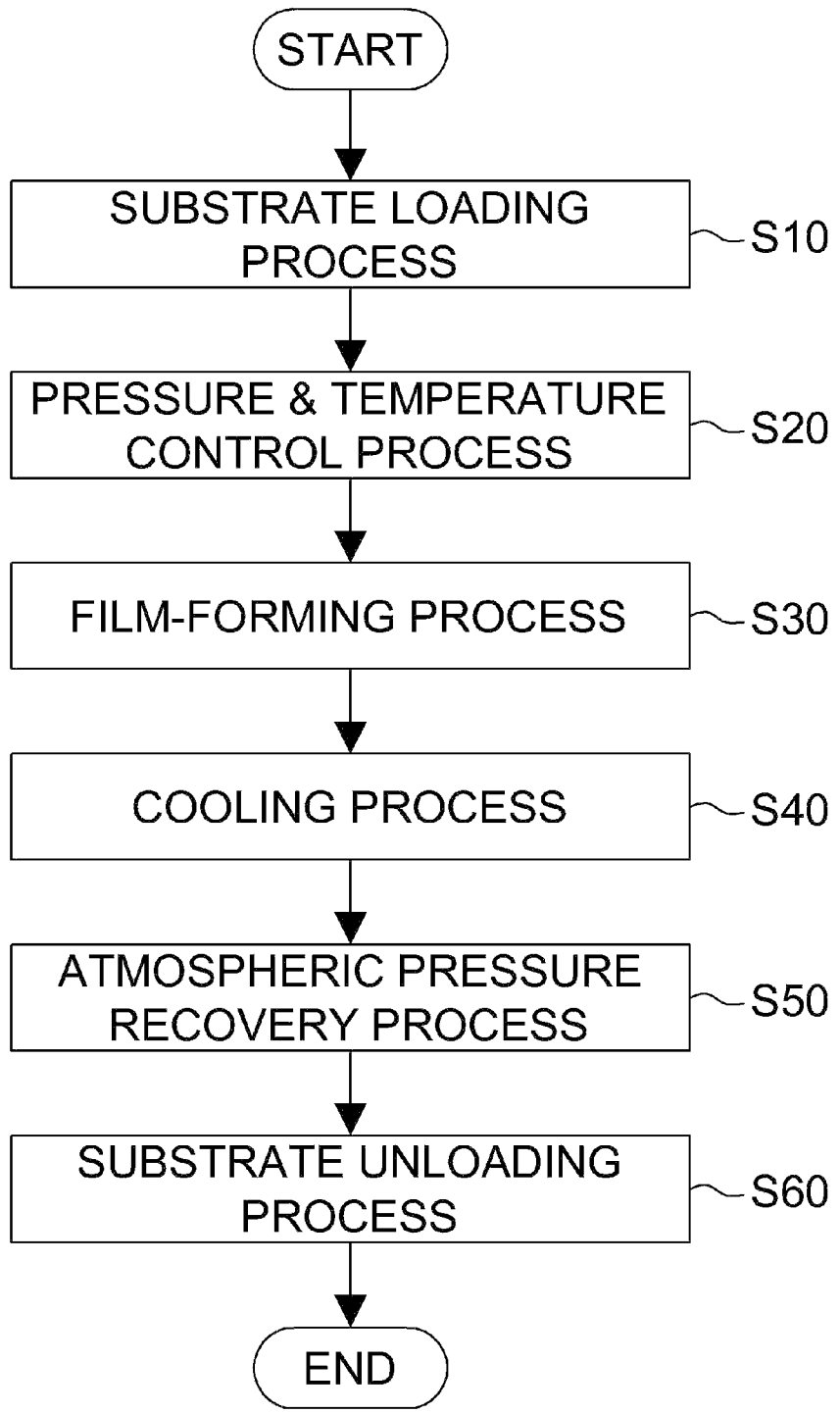

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This application is a continuation of International Application No. PCT/JP2013/084632, filed on Dec. 25, 2013, which claims priority under 35 U.S.C. § 119(a)-(d) to Application No. JP 2013-053182 filed on Mar. 15, 2013, the entire contents of which are hereby incorporated by reference.

FIELD OF THE INVENTION

The present invention relates to a substrate processing apparatus configured to process a substrate by heating the substrate, a method of manufacturing a semiconductor device and a non-transitory computer-readable recording medium.

BACKGROUND

A processing apparatus for manufacturing a semiconductor device such as a large-scale integrated (LSI) circuit employs a method of reducing an oxygen concentration in the processing apparatus or an oxygen concentration in a pod transferred to the processing apparatus so as to suppress a natural oxide film from being formed on a substrate to be processed (See, for example, Japanese Unexamined Patent Application Publication No. 2011-61156).

However, the processing apparatus is not capable of improving a manufacturing quality or throughput of a semiconductor device while suppressing formation of a natural oxide film as required in latest micro-fabrication technologies.

SUMMARY

It is an object of the present invention to provide a substrate processing apparatus capable of improving the quality and manufacturing throughput of a semiconductor device while suppressing formation of a natural oxide film, a method of manufacturing a semiconductor device and a non-transitory computer-readable recording medium.

According to one aspect of the present invention, there is provided a technique including: a substrate container transfer device configured to transfer a substrate container accommodating a substrate and purge an inside of the substrate container; a purge gas supply unit installed at the substrate container transfer device and configured to supply a purge gas into the substrate container; a substrate container standby unit configured to accommodate the substrate container; a contact preventing unit installed at the substrate container standby unit and configured to prevent a contact between the purge gas supply unit and the substrate container standby unit when the substrate container is transferred to the substrate container standby unit by the substrate container transfer device; and a control unit configured to control the substrate container transfer device and the purge gas supply unit.

BRIEF DESCRIPTION OF THE DRAWINGS

FIG. 12 is a flowchart of a process of unloading a substrate container according to an embodiment of the present invention.

FIGS. 13A and 13B are graphs showing examples of a variation in an oxygen concentration in a substrate container according to embodiments of the present invention, in which FIG. 13A illustrates a variation in an oxygen concentration in a pod when first purging is performed and FIG. 13B illustrates a variation in an oxygen concentration in the pod when second purging is performed.

FIG. 14 is a flowchart of a substrate processing process according to an embodiment of the present invention.

DETAILED DESCRIPTION

Structure of Substrate Processing Apparatus

Figure 1:
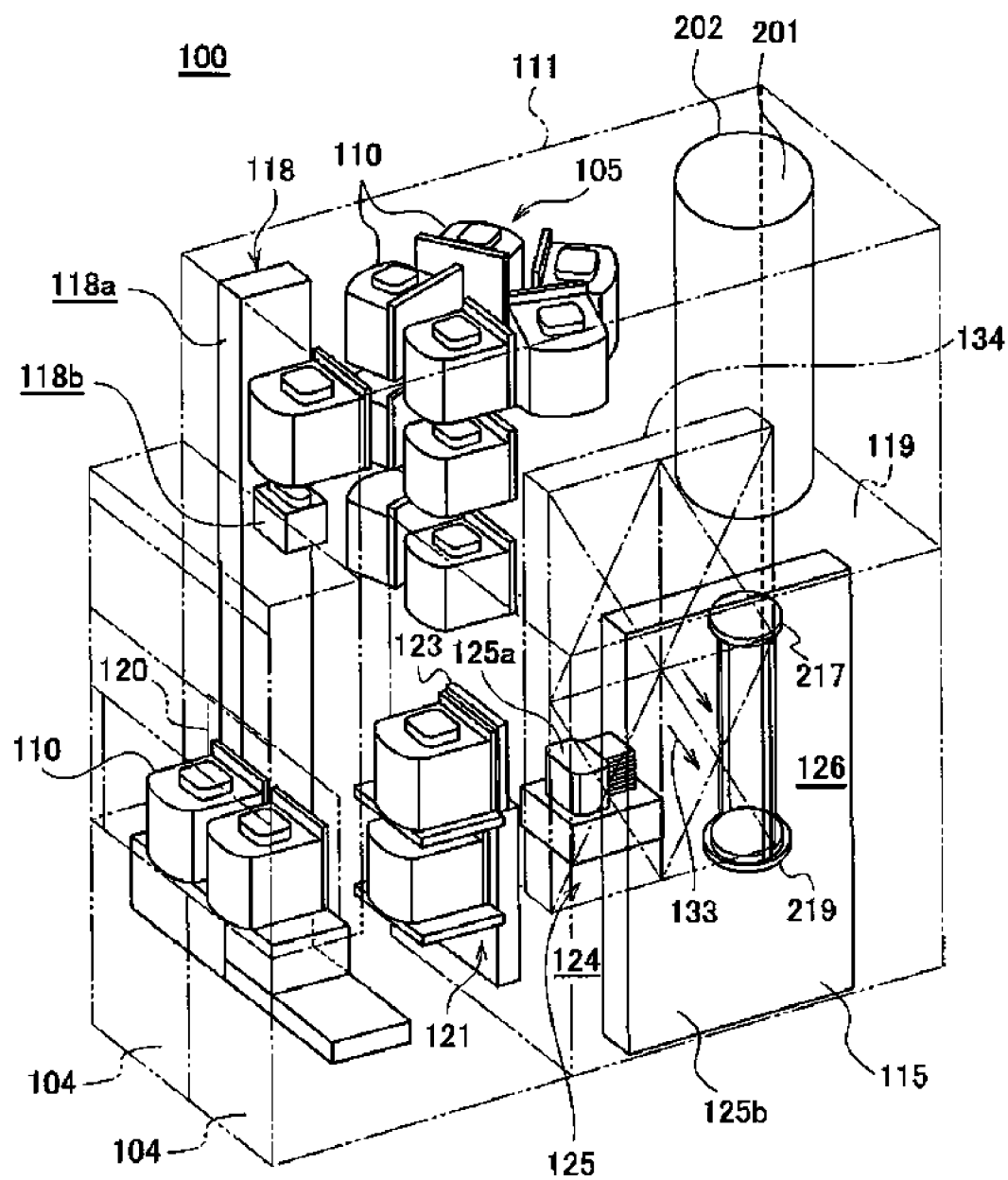
FIG. 1 is an oblique perspective view of a substrate processing apparatus according to an embodiment of the present invention.
Figure 2:
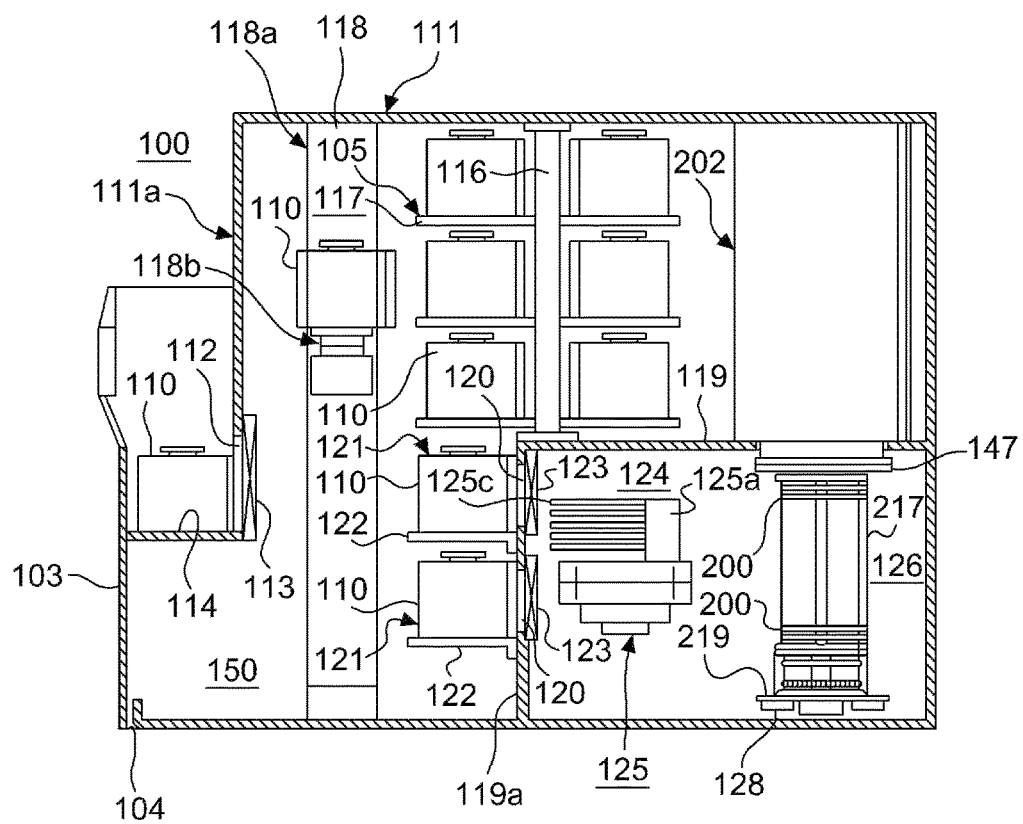
FIG. 2 is a side perspective view of a substrate processing apparatus according to an embodiment of the present invention.

First, a structure of a substrate processing apparatus 100 according to an embodiment of the present invention will be described mainly with reference to FIGS. 1 and 2. FIG. 1 is an oblique perspective view of the substrate processing apparatus 100 according to an embodiment of the present invention. FIG. 2 is a side perspective view of the substrate processing apparatus 100 according to an embodiment of the present invention. The substrate processing apparatus 100 according to the present embodiment performs a process of forming a film on substrate, a process of modifying a film, or the like, which is included in a process of manufacturing a semiconductor device or a semiconductor element. Here, the semiconductor device means an integrated circuit such as an LSI described above, a microprocessor, a semiconductor memory, etc. Also, the semiconductor element means a diode, a transistor, a thyristor, etc.

As illustrated in FIGS. 1 and 2, the substrate processing apparatus 100 according to the present embodiment includes a housing 111 configured as a pressure-resistant container. At a front of a front wall 111a of the housing 111, a front maintenance port 103 is formed as an opening through which maintenance may be performed. A front maintenance door 104 is installed at the front maintenance port 103 to open/close the front maintenance port 103.

Pods 110 serving as wafer carriers (substrate containers) for accommodating a plurality of wafers 200 serving as substrates are used to transfer the wafers 200 to the inside or outside of the housing 111. The pod 110 is also referred to as a front opening unified pod (FOUP). On the front wall 111a of the housing 111, a pod loading/unloading port (substrate container loading/unloading port) 112 is installed to communicate with the inside/outside of the housing 111. The pod loading/unloading port 112 is configured to be opened/closed by a front shutter (substrate container loading/unloading port opening/closing mechanism) 113. A loading port (substrate container receiving support) 114 is installed below the front of the pod loading/unloading port 112. The pod 110 is configured to be transferred by an in-process transfer device (not shown), and placed on the loading port 114 to adjust the position of the pod 110. The wafers 200 are formed of, for example, silicon (Si) or the like. A metal film is formed on the wafer 200 as a metal wire or an electrode that constitutes a semiconductor device. However, an undesired natural oxide film is likely to be formed on the metal film. Also, a semiconductor device formed on the wafer 200 may have a complicated structure. Also, a substrate on which a semiconductor device is to be formed may have a large surface area. For example, a concavo-convex structure having a high aspect ratio may be formed on the substrate. A natural oxide film is likely to be locally formed on a substrate having a complicated structure or a large surface area. Also, as wafers are becoming bigger, the surface areas of the wafers increase and thus a natural oxide film may be locally formed thereon.

The inventors of the present application have found that a technology of lowering an oxygen concentration which will be described below is required to improve a manufacturing quality and throughput of a semiconductor device while suppressing a natural oxide film from being formed on the wafer 200.

Substrate Container Storage Chamber

In the housing 111, a substrate container storage chamber 150 serving as a space to which the pod 110 is to be transferred is formed in the rear of the loading port 114.

Substrate Container Transfer Device

In the housing 111, a pod transfer device (substrate container transfer device) 118 is installed near the loading port 114. In the housing 111, a rotary substrate container standby unit (substrate container placing shelf) 105 is installed upward on a roughly central portion between the front and back of the housing 111 to be more inwardly than the pod transfer device 118.

The pod transfer device 118 includes a pod elevator (substrate container lifting mechanism) 118a that may be moved vertically while retaining the pod 110 therein, a pod transfer mechanism (substrate container transfer mechanism) 118b serving as a transfer mechanism and a pod transfer board 118c (see FIG. 4) on which the pod 110 is placed. The pod transfer device 118 is configured to transfer the pod 110 between the loading port 114, the substrate container standby unit 105 which will be described below and a pod opener 121 through continuous operations of the pod elevator 118a and the pod transfer mechanism 118b.

Figure 4:
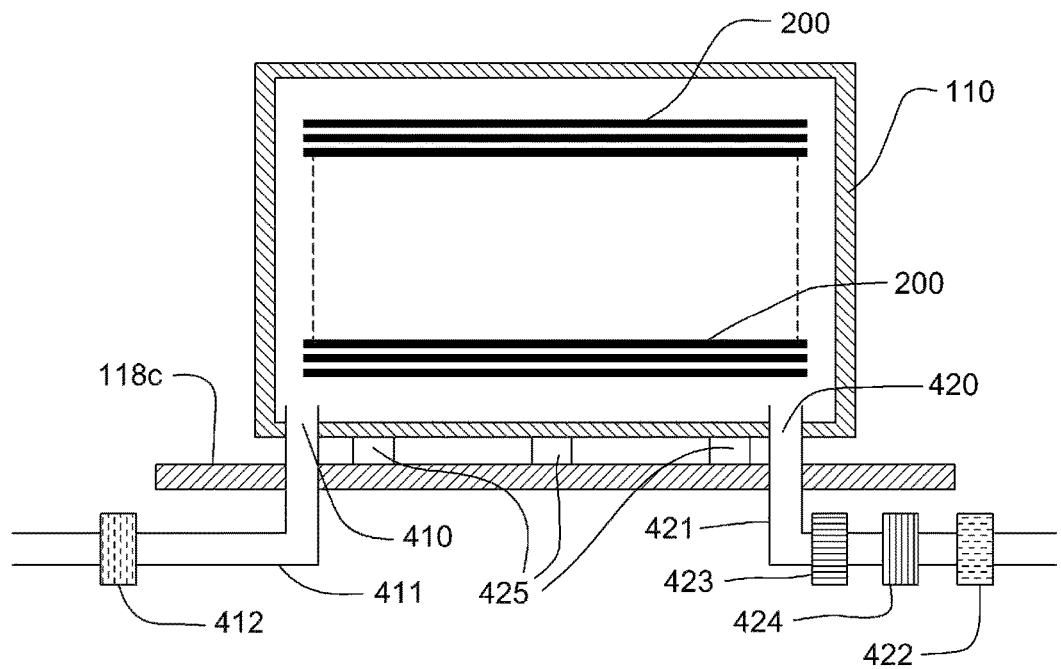
FIG. 4 is a diagram illustrating a structure of a main placing unit according to an embodiment of the present invention.

The pod transfer device (substrate container transfer device) 118 and the pod 110 according to an embodiment of the present invention will be described in detail with reference to FIGS. 4 to 8. Referring to FIG. 4, the pod transfer board (substrate container transfer board) 118c is installed on the pod transfer mechanism 118b. In the present embodiment, three kinematic pins 425 are vertically installed on a top surface of the pod transfer board 118c. Also, inert gas ports 420 and 410 are installed.

Figure 5:
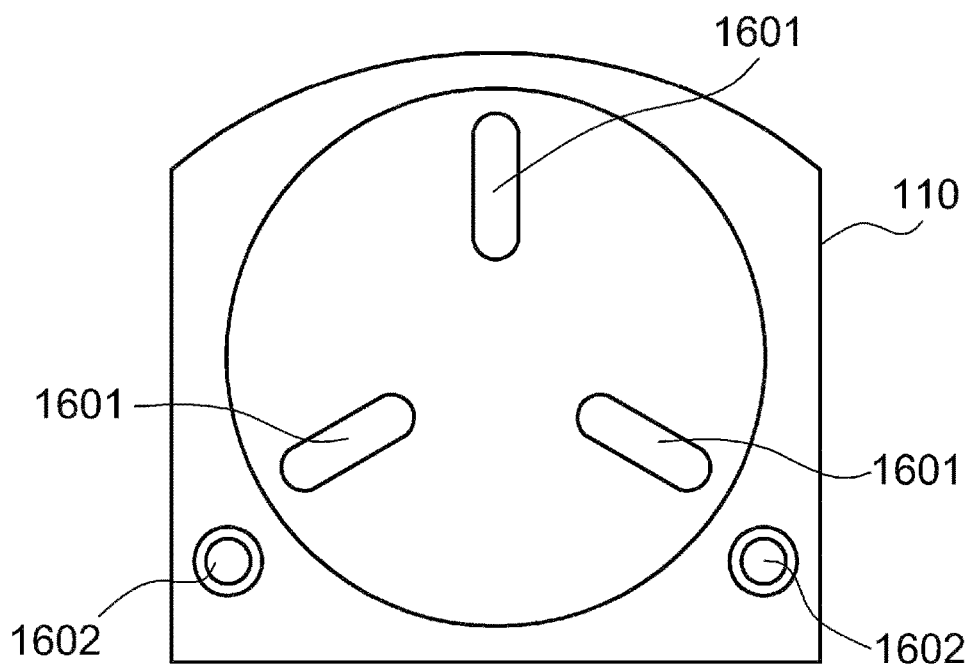
FIG. 5 is a bottom view of a pod according to an embodiment of the present invention.

FIG. 5 is a bottom view of the pod 110. At a bottom surface of the pod 110, kinematic pin insertion holes 1601, the number of which is equal to the number of the kinematic pins 425 described above are installed such that the three kinematic pins 425 are inserted thereinto. Also, purge ports 1602 are respectively installed at a plurality of locations on the bottom surface of the pod 110 to introduce a purge gas and exhaust an atmosphere in the pod 110. In the present embodiment, the purge ports 1602 are respectively installed at two locations on the bottom surface of the pod 110.

Figure 6:
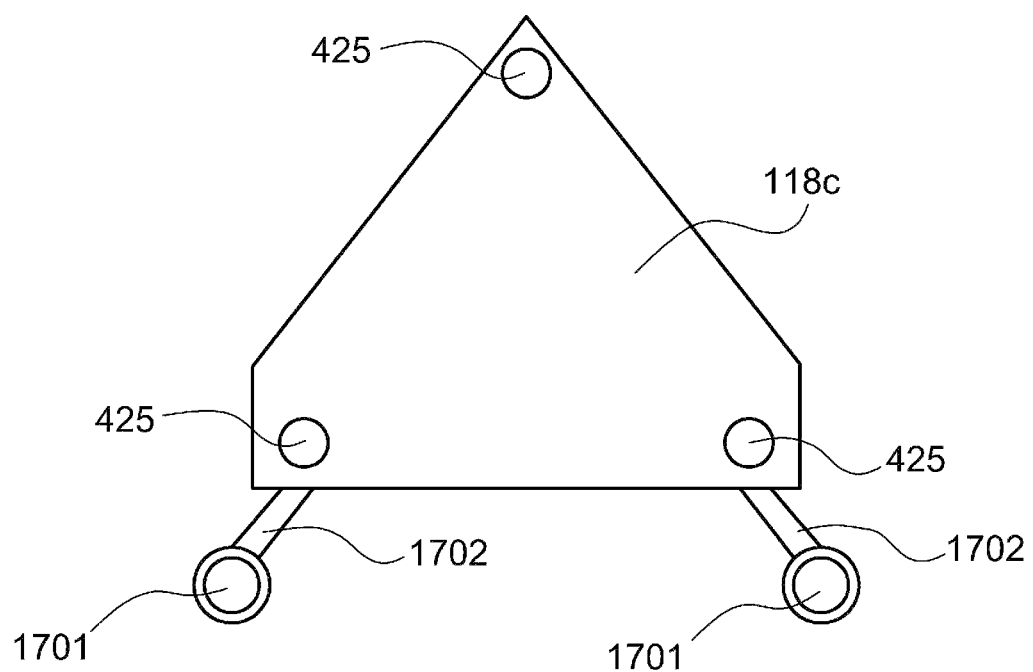
FIG. 6 is a top view of a substrate container transfer board according to an embodiment of the present invention.
Figure 7:
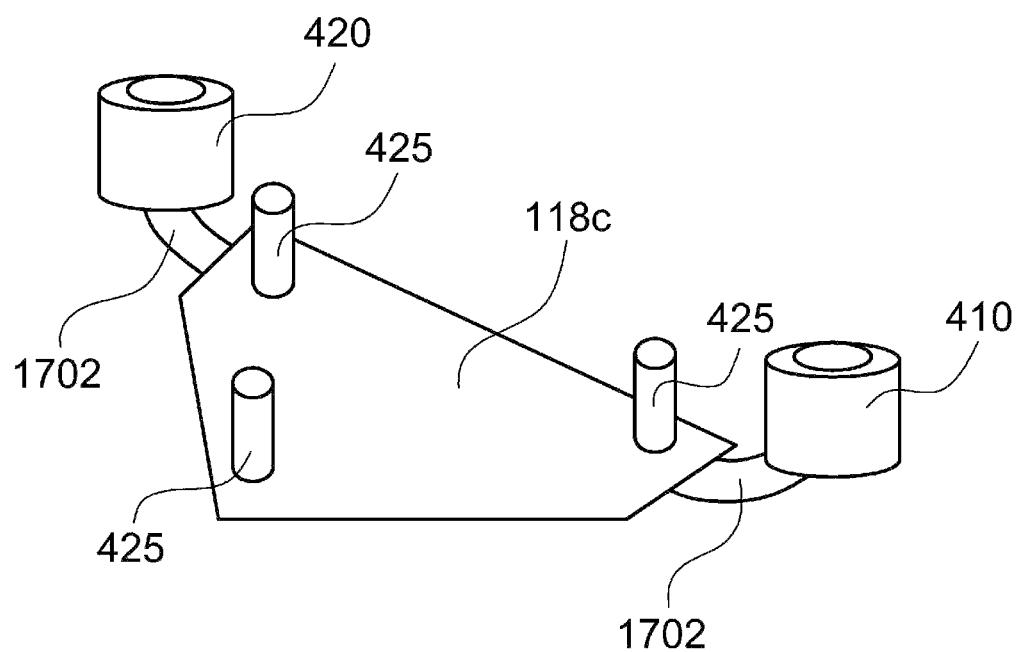
FIG. 7 is a perspective view of a substrate container transfer board according to an embodiment of the present invention.

FIG. 6 is a top view of the pod transfer board (substrate container transfer board) 118c. FIG. 7 is a perspective view of the pod transfer board (substrate container transfer board) 118c. The kinematic pins 425, the number of which is equal to that of the kinematic pin insertion holes 1601 are installed at locations corresponding to the kinematic pin insertion holes 1601 installed at the bottom surface of the pod 110. Also, for example, purge gas supply units 1701 are installed at two locations on the bottom surface of the pod 110 to introduce a purge gas. The purge gas supply units 1701 are connected to the pod transfer board 118c via an evacuation mechanism 1702 not to meet the purge ports 1602 on the substrate container standby unit 105 when the purge gas supply units 1701 approach the substrate container standby unit 105 which will be described below, thereby avoiding interference with the purge ports 1602 on the substrate container standby unit 105.

Figure 8:
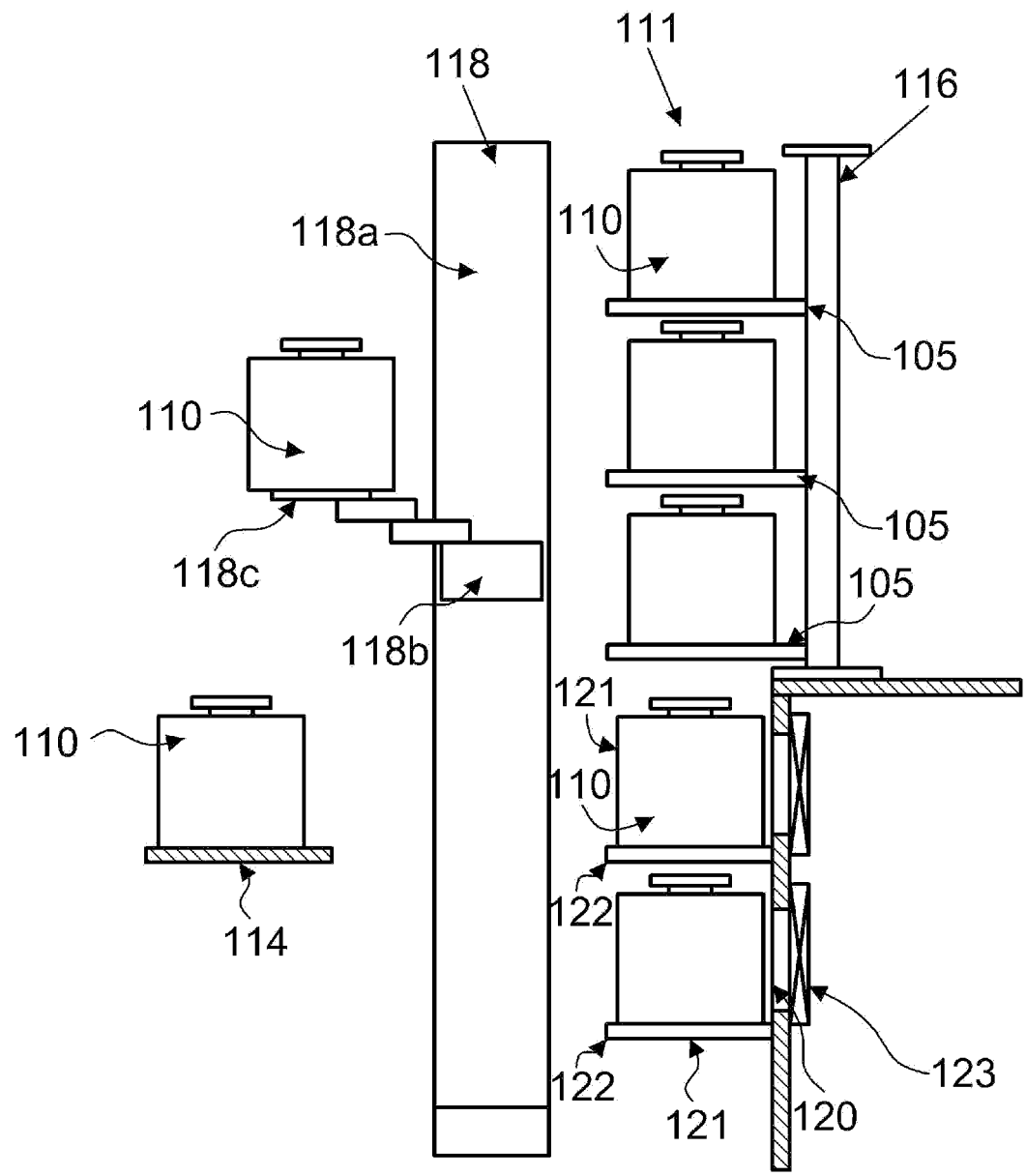
FIG. 8 illustrates transferring of a substrate container according to an embodiment of the present invention.

FIG. 8 illustrates transferring of a substrate container according to an exemplary embodiment of the present invention. Referring to FIG. 8, purging of the inside of the pod 110 will be described with respect to a case in which the pod 110 on the loading port 114 is transferred to the substrate container standby unit 105. The pod 110 is placed on the pod transfer board 118c by lifting the pod 110 on the loading port 114 from below using the pod transfer board 118c installed on the pod transfer mechanism 118b by controlling the pod transfer mechanism (substrate container transfer mechanism) 118b in an upward, downward, left, or right direction. In this case, the kinematic pins 425 on the pod transfer board 118c are inserted into the kinematic pin insertion holes 1601 formed in the bottom surface of the pod 110, and the purge gas supply units 1701 are connected to the purge ports 1602 on the bottom surface of the pod 110. While the lifted pod 110 is transferred to the substrate container standby unit 105 which is a transfer place, a purge gas is supplied into the pod 110 via the purge ports 1602. As described above, according to the present invention, the effects described above may be obtained by supplying the purge gas into the pod 110 while the pod 110 is transferred.

Similarly, a purge gas is supplied into the pod 110 while the pod transfer device 118 is transferred from the loading port 114 to the pod opener (substrate container opening/closing unit) 121 and while the pod 110 on the substrate container standby unit 105 is transferred to the pod opener (substrate container opening/closing unit) 121. Also when a purge gas is supplied into the pod 110 placed on the substrate container standby unit 105, the pod 110 on the substrate container standby unit 105 may be lifted from below using the pod transfer board 118c and a purge gas may be supplied into the pod 110 during the lifting of the pod 110 (a pick-up operation). Also, purge gas supply units may be present on the substrate container standby unit 105 to supply a purge gas into the pod 110 while the pod 110 is placed on the substrate container standby unit 105. In this case, the purge gas supply units 1701 on the pod transfer board 118c according to an embodiment of the present invention may be configured to be withdrawn not to interfere with the purge gas supply units in the substrate container standby unit 105.

As described above, when the purge gas supply units 1701 are installed on the pod transfer board 118c configured to transfer the pod 110, an atmosphere in the pod 110 may be replaced with an inert gas while the pod 110 is transferred. Also, the atmosphere in the pod 110 placed on the substrate container standby unit 105, the loading port 114 or the pod opener (substrate container opening/closing unit) 121 may be replaced with an inert gas by simply picking up the pod 110 to the pod transfer board 118c. Thus, particles that are likely to be generated due to vibration during the transfer of the pod 110 may be reduced.

First Purge Unit

As illustrated in FIG. 2, in the housing 111, the pod transfer device (substrate container transfer device) 118 is installed as a first purge unit (a main placing unit) in the front of the central portion of the housing 111 to purge an atmosphere in the pod 110, control an oxygen concentration in the pod 110 to be less than or equal to a predetermined management value, and transfer the pod 110. In the pod transfer device (substrate container transfer device) 118, the pod transfer board 118c and a main purge port illustrated in FIG. 4 are installed. At the main purge port, a main gas supply port 410 and a main gas exhaust port 420 are installed. A gas supply pipe 411 is connected to the main gas supply port 410. A main flow-rate control device 412 is installed at the gas supply pipe 411, and configured to control a flow rate of a gas under control of a controller 280 which will be described below. The main flow-rate control device 412 includes at least one of a valve (not shown) and a mass flow controller (MFC) (not shown). A gas exhaust pipe 421 is connected to the main gas exhaust port 420. Also, a main exhaust valve 422 may be installed at the gas exhaust pipe 421 to control a gas exhaust rate. Also, an oxygen concentration meter 423 may be installed at the gas exhaust pipe 421 to detect an oxygen concentration either in the pod 110 or in a gas exhausted from the pod 110. Also, a dew-point meter 424 may be installed to detect humidity in the pod 110 or in a gas exhausted from the pod 110.

Second Purge Unit

Figure 9:
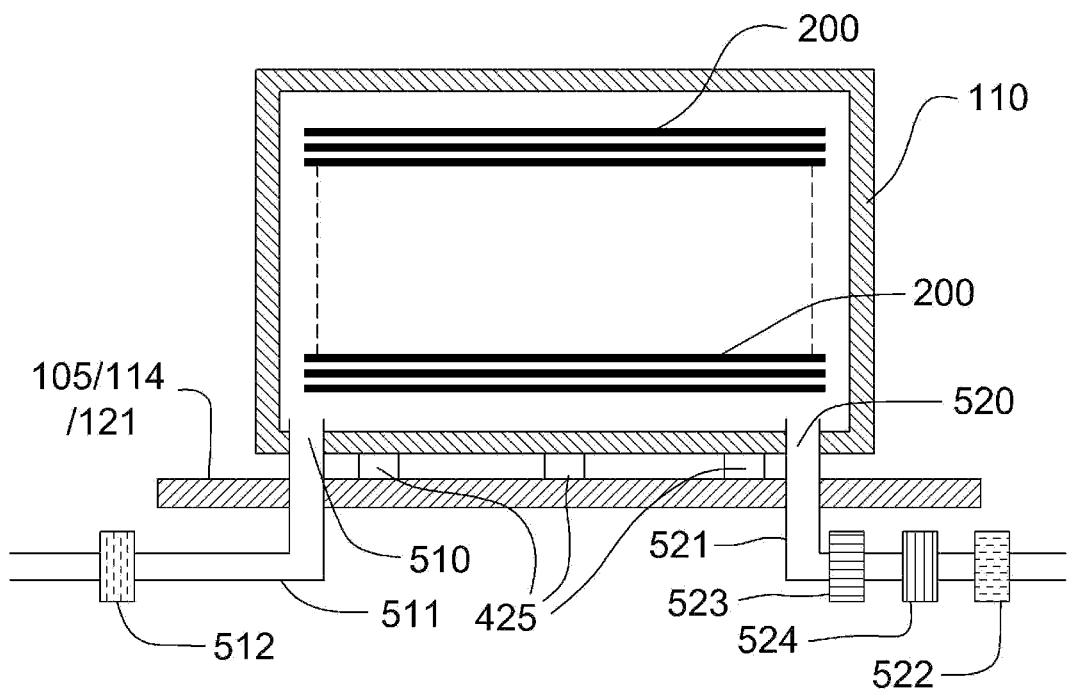
FIG. 9 illustrates a structure of a sub-placing unit according to an embodiment of the present invention.

In the housing 111, the substrate container standby unit 105, the loading port 114 and the pod opener (substrate container opening/closing unit) 121 are installed together as a second purge unit (sub-placing unit) in the substrate container storage chamber 150. In the substrate container standby unit 105, a plurality of shelf boards (substrate container placing boards) 117 are installed to store a plurality of pods 110 thereon. Also, a purge port is installed on each of the plurality of shelf boards 117, the loading port 114 and the pod opener (substrate container opening/closing unit) 121, and configured to purge the inside of the pod 110 (gas replacement) such that an oxygen concentration in the pod 110 is equal to a predetermined management value or less. The substrate container standby unit 105 may be a rotary type. When the substrate container standby unit 105 is a rotary type, a pillar 116 is vertically installed to be intermittently rotated within a horizontal plane, together with the plurality of shelf boards 117. FIG. 9 illustrates the substrate container standby unit 105 [the loading port 114 and the pod opener (substrate container opening/closing unit) 121)], but a gas supply port 510 and a gas exhaust port 520 may be installed at the purge port. A gas supply pipe 511 is installed at the gas supply port 510. At the gas supply pipe 511, a sub flow-rate control device 512 is installed and configured to control a flow rate of a gas under control of the controller 280 which will be described below. The sub flow-rate control device 512 includes at least one of a valve (not shown) and an MFC (not shown). A gas exhaust pipe 521 is installed at the gas exhaust port 520. A sub-exhaust valve 522 may be installed at the gas exhaust pipe 521 to control a gas exhaust rate. Also, an oxygen concentration meter 523 may be installed at the gas exhaust pipe 521 to detect an oxygen concentration in the pod 110 or in an exhaust gas. Also, a dew-point meter 524 may be installed to detect humidity in the pod 110 or in an exhaust gas.

Predetermined Management Values

A first management value and a second management value are set as predetermined management values for managing an oxygen concentration in the pod 110. The first management value and the second management value are recorded on a recording medium which will be described below, and are set to vary according to a result of calculation performed by a central processing unit (CPU) 280a will be described below. Also, the first management value and the second management value are set according to data input from an input device 281. The first management value is preferably set to be lower than a range of the second management value. More preferably, the first management value is 600 ppm and the second management value is in a range of 600 ppm to 1,000 ppm. During the transfer of the pod 110 (the pod transfer board 118c), the inside of the pod 110 is purged to have the first management value or less, and the inside of the pod 110 on the substrate container standby unit 105, the loading port 114 or the pod opener (substrate container opening/closing unit) 121 is purged to have a value that is in the range of the second management value. Hereinafter, the purging of the inside of the pod 110 to have the first management value or less will be referred to as 'first purging (pre-purging)' and the purging of the inside of the pod 110 to have a value that is in the range of the second management value will be referred to as 'second purging').

When first purging is performed, an inert gas is supplied into the pod 110 at a first flow rate via the purge ports 1602 on the pod transfer board 118c. When second purging is performed, an inert gas is supplied into the pod 110 at a second flow rate via the purge port 1602 on the substrate container standby unit 105 or the pod opener (substrate container opening/closing unit) 121. The first flow rate is in a range of 20 slm to 100 slm. For example, the first flow rate is 50 slm. The second flow rate is in a range of 0.5 slm to 20 slm. For example, the second flow rate is 5 slm.

Method of Controlling Oxygen Concentration in Pod

An oxygen concentration in the pod 110 may be controlled by detecting an oxygen concentration in the pod 110 or in an exhaust gas using the oxygen concentration meters 423 and 523 described above, and feed-back controlled based on the detected oxygen concentration. Otherwise, an oxygen concentration in the pod 110 may be controlled by determining the relationship among a feed rate and duration of an inert gas and the oxygen concentration in the pod 110 beforehand and setting the feed rate and duration of the inert gas.

As illustrated in FIGS. 1 and 2, at a lower portion in the housing 111, a sub-housing 119 is installed from the roughly central portion between the front and back of the housing 111 to a rear end of the housing 111. A pair of wafer loading/unloading ports (substrate loading/unloading ports) 120 configured to transfer the wafer 200 inside/outside the sub-housing 119 are vertically installed on upper and lower ends of a front wall 119a of the sub-housing 119. The pod opener (substrate container opening/closing unit) 121 is installed at each of the wafer loading/unloading ports 120 on the upper and lower ends of the front wall 119a.

Each of the pod openers 121 includes one of a pair of placing tables 122 configured to place the pods 110 thereon and a cap attaching/detaching mechanism (lid attaching/detaching mechanism) 123 for attaching/detaching a cap (lid) of the pod 110. Each of the pod openers 121 is configured to open/close a wafer entrance of the pod 110 by attaching/detaching the cap of the pod 110 placed on the placing table 122 with the cap attaching/detaching mechanism 123.

In the sub-housing 119, a transfer chamber 124 is formed as a substrate storage chamber fluidically insulated from a space in which the pod transfer device 118 or the substrate container standby unit 105 which is a rotary type is installed. A wafer transfer mechanism (substrate transfer mechanism) 125 is installed in a front region of the transfer chamber 124. The wafer transfer mechanism 125 includes a wafer transfer device (substrate transfer device) 125a for linearly moving or rotating the wafer 200 in a horizontal direction and a wafer transfer device elevator (substrate transfer device lifting mechanism) 125b for moving the wafer transfer device 125a upward or downward (see FIG. 1). The wafer transfer device elevator 125b is installed between a right end of the front region of the transfer chamber 124 of the sub-housing 119 and a right end of the housing 111 (see FIG. 1). The wafer transfer device 125a includes tweezers (substrate retainer) 125c as a unit of placing the wafer 200. Through continuous operations of the wafer transfer device elevator 125b and the wafer transfer device 125a, the wafer 200 is loaded (charged) on or unloaded (discharged) from a boat (substrate retainer) 217.

A standby unit 126 is provided in a rear region of the transfer chamber 124 to accommodate the boat 217 to be used. A process container 202 configured to process the wafer 200 is installed above the standby unit 126. A lower end portion of the process container 202 is configured to be opened or closed by a furnace port shutter (furnace port opening/closing mechanism) 147. The structure of the process container 202 will be described below.

A boat elevator (substrate retainer lifting mechanism) 115 is installed between a right end of the standby unit 126 of the sub-housing 119 and a right end of the housing 111 to move the boat 217 upward/downward (see FIG. 1). An arm 128 is connected as a connector to a lifting platform of the boat elevator 115. A seal cap 219 is horizontally installed as a furnace port lid at the arm 128. The seal cap 219 vertically supports the boat 217, and configured to close the lower end portion of the process container 202.

The boat 217 is configured to horizontally retain a plurality of wafers 200 (e.g., about 50 to 125 wafers 200) in a state in which the wafers 200 are vertically arranged in a concentric form.

As illustrated in FIG. 1, a clean air unit 134 is installed at a left end of the transfer chamber 124 opposite the wafer transfer device elevator 125b and the boat elevator 115. The clean air unit 134 includes a supply fan and a dustproof filter to supply clean air 133 which is a clean atmosphere or an inert gas. The clean air 133 blown out of the clean air unit 134 circulates around a notch alignment device 135, the wafer transfer device 125a and the boat 217 present in the standby unit 126, is absorbed by a duct (not shown), is exhausted outside the housing 111 or circulates to a first side (supply side) which is an absorbing side of the clean air unit 134, and is then blown out to the transfer chamber 124 again via the clean air unit 134.

Structure of Process Container

Figure 3:
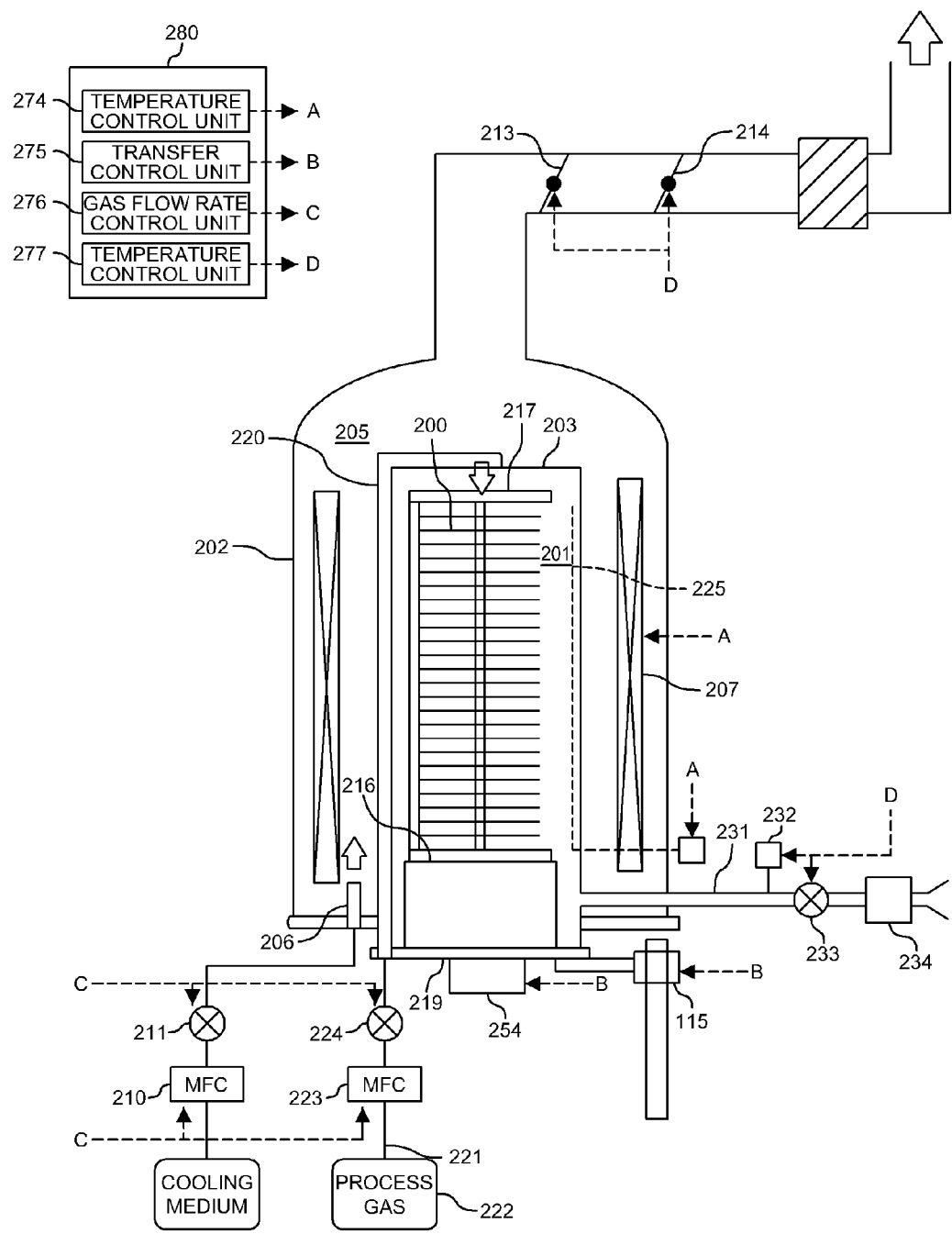
FIG. 3 is a vertical cross-sectional view of a process container of a substrate processing apparatus according to an embodiment of the present invention.

Next, the structure of the process container 202 according to the present embodiment will be described with reference to FIG. 3 below. FIG. 3 is a vertical cross-sectional view of the process container 202 of the substrate processing apparatus 100 according to the present embodiment.

Process Container

As illustrated in FIG. 3, the process container 202 includes a reaction tube 203. The reaction tube 203 is formed of, for example, a heat-resistant material such as quartz ($SiO_2$) or silicon carbide (SiC), and has a cylindrical shape, the upper and lower ends of which are open. A process chamber 201 configured to process the wafer 200 as a substrate is formed in a hollow tubular portion of the reaction tube 203. The process chamber 201 is configured to accommodate the boat 217 retaining the wafer 200.

The boat 217 serving as a substrate retainer is configured to retain a plurality of wafers 200 in a multistage manner in a state in which the plurality of wafers 200 are arranged in a horizontal posture and a concentric form. The boat 217 is formed of, for example, a heat-resistant material such as at least one of quartz ($SiO_2$) and silicon carbide (SiC). An insulator 216 formed of, for example, a heat-resistant material such as at least one of quartz ($SiO_2$) and silicon carbide (SiC) is installed below the boat 217, and configured to prevent heat generated from a heater 207 (which will be described below) from being delivered to the seal cap 219.

Below the reaction tube 203, the seal cap 219 is installed as a furnace port lid for air-tightly closing a lower end aperture of the reaction tube 203. The seal cap 219 is configured to come in contact with a lower end of the reaction tube 203 from below in a vertical direction. The seal cap 219 is formed of, for example, a metal such as stainless steel and has a disc shape. An O-ring serving as a seal member that comes in contact with the lower end of the reaction tube 203 is installed on an upper surface of the seal cap 219. As described above, the seal cap 219 is configured to be vertically moved by the boat elevator 115 that is a lifting mechanism vertically installed outside the reaction tube 203. The boat 217 may be transferred inside or outside the process chamber 201 by moving the seal cap 219 upward or downward.

A boat rotation mechanism 254 that rotates the boat 217 is installed near the center of the seal cap 219 and at a side of the seal cap 219 opposite the process chamber 201. A rotation shaft of the boat rotation mechanism 254 is configured to support the boat 217 from below while passing through the seal cap 219. The boat rotation mechanism 254 is configured to rotate the boat 217 so as to rotate the wafer 200.

A transfer control unit 275 is electrically connected to the boat rotation mechanism 254 and the boat elevator 115. The transfer control unit 275 is configured to control the boat rotation mechanism 254 and the boat elevator 115 to perform desired operations at a desired timing. Also, the transfer control unit 275 is electrically connected to the pod elevator 118a, the pod transfer mechanism 118b, the pod transfer board 118c, the pod opener 121, the wafer transfer device 125a, the wafer transfer device elevator 125b, etc. described above, and configured to control them to perform desired operations at a desired timing. A transfer system according to the present embodiment mainly includes the boat elevator 115, the boat rotation mechanism 254, the pod elevator 118a, the pod transfer mechanism 118b, the pod transfer board 118c, the pod opener 121, the wafer transfer device 125a and the wafer transfer device elevator 125b.

The heater 207 serving as a heating unit is installed to surround sidewall surfaces of the reaction tube 203 at an outer side of the reaction tube 203 so as to heat the wafer 200 present in the reaction tube 203. The heater 207 has a cylindrical shape and is vertically installed by being supported by a heater base as a retaining board.

A temperature sensor 225 serving as a temperature detector, e.g., a thermocouple, is installed in the reaction tube 203. A temperature control unit 274 is electrically connected to the heater 207 and the temperature sensor 225. The temperature control unit 274 is configured to control an amount of electric current to be supplied to the heater 207 based on temperature information detected by the temperature sensor 225 such that temperature in the process chamber 201 has a desired temperature distribution at a desired timing.

A process gas supply nozzle 220 is installed between the reaction tube 203 and the heater 207. The process gas supply nozzle 220 is installed to follow a side of an outer wall of the reaction tube 203. An upper end (downstream end) of the process gas supply nozzle 220 is air-tightly installed at the top of the reaction tube 203 (an aperture formed in an upper end of the reaction tube 203). A plurality of process gas supply holes are formed in the process gas supply nozzle 220 present at the aperture in the upper end of the reaction tube 203.

A downstream end of a process gas supply pipe 221 configured to supply a process gas is connected to an upstream end of the process gas supply nozzle 220. At the process gas supply pipe 221, a process gas source 222, an MFC 223 serving as a flow rate controller and a valve 224 serving as an opening/closing valve are sequentially installed from an upstream end.

A gas flow rate control unit 276 is electrically connected to the MFC 223. The gas flow rate control unit 276 is configured to control the MFC 223 such that the flow rate of a gas supplied into the process chamber 201 becomes equal to a desired flow rate at a desired timing.

A process gas supply system mainly includes the process gas supply pipe 221, the MFC 223 and the valve 224. The process gas supply system may further include the process gas supply nozzle 220 or the process gas source 222.

An upstream end of an exhaust pipe 231 is connected to the reaction tube 203 so as to exhaust an atmosphere in the reaction tube 203 (the process chamber 201). At the exhaust pipe 231, a pressure sensor 232 serving as a pressure detector (a pressure detection unit) for detecting an inner pressure of the process chamber 201, an auto pressure controller (APC) valve 233 serving as a pressure adjustor (a pressure adjust unit) and a vacuum pump 234 serving as a vacuum exhaust device are sequentially installed from the upstream end. The APC valve 233 is an opening/closing valve configured to perform or suspend vacuum-exhaust in the reaction tube 203 by opening/closing the APC valve 233 and to adjust the inner pressure of the reaction tube 203 by controlling the degree of openness of the APC valve 233.

A pressure control unit 277 is electrically connected to the APC valve 233 and the pressure sensor 232. The pressure control unit 277 is configured to control the APC valve 233 based on a pressure detected by the pressure sensor 232 such that the inner pressure of the process chamber 201 becomes equal to a desired pressure at a desired timing.

A process gas exhaust unit mainly includes the exhaust pipe 231, the pressure sensor 232 and the APC valve 233. The process gas exhaust unit may further include the vacuum pump 234.

Control Unit

Figure 10:
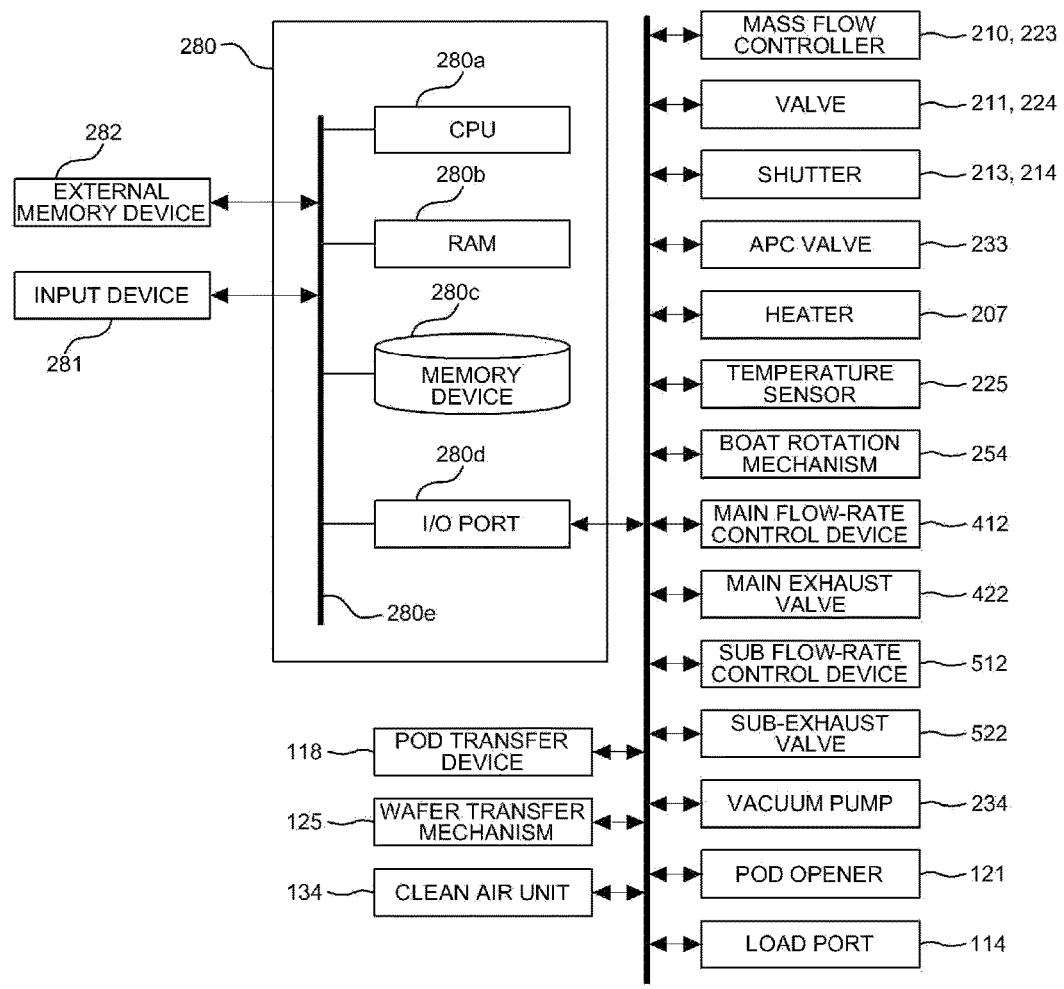
FIG. 10 schematically illustrates a structure of a controller of a substrate processing apparatus according to an embodiment of the present invention.

As illustrated in FIG. 10, the controller 280 which is a control unit (control means) is configured as a computer that includes the CPU 280a, a random access memory (RAM) 280b, a memory device 280c and an input/output (I/O) port 280d. The RAM 280b, the memory device 280c and the I/O port 280d are configured to exchange data with the CPU 280a via an internal bus 280e. The input device 281 such as a touch panel, a mouse, a keyboard, a manipulation terminal or the like may be connected to the controller 280. Also, a display unit such as a display, etc. may be connected to the controller 280.

The memory device 280c is configured, for example, as a flash memory, a hard disk drive (HDD), a compact disc-read-only memory (CD-ROM), etc. In the memory device 280c, a control program for controlling an operation of the substrate processing apparatus 100, a process recipe including the order or conditions of substrate processing which will be described below, or the like is stored to be readable. The process recipe is a combination of sequences (steps) of a substrate processing process which will be described below to obtain a desired result when the sequences (steps) are performed by the controller 280, and acts as a program. Hereinafter, the process recipe, the control program, etc. will be referred to together simply as a 'program.' Also, when the term 'program' is used in the present disclosure, it may be understood as including only a process recipe, only a control program, or both of the process recipe and the control program. The RAM 280b is configured as a memory area (work area) in which a program or data read by the CPU 280a is temporarily stored.

The I/O port 280d is connected to the MFCs 210 and 223, the valves 211 and 224, shutters 213 and 214, the APC valve 233, the heater 207, the temperature sensor 225, the boat rotation mechanism 254, the main flow-rate control device 412, the main exhaust valve 422, the sub flow-rate control device 512, the sub-exhaust valve 522, the vacuum pump 234, the pod opener 121, the loading port 114, the pod transfer device 118, the wafer transfer mechanism 125, the clean air unit 134, etc.

The CPU 280a is configured to read and execute the control program from the memory device 280c and to read the process recipe from the memory device 280c according to a manipulation command or the like received via the input device 281. The CPU 280a configured to, based on the read process recipe, control temperature using the heater 207 based on the temperature sensor 225 using a signal line A; control the rotation speed of the boat rotation mechanism 254 using a signal line B; control the flow rates of various gases via the MFCs 210 and 223 using a signal line C;

control opening/closing of the valves 211 and 224 using a signal line D, control shutting of the shutters 213 and 214; control the degree of openness of the APC valve 233; and control driving/suspending of the vacuum pump 234.

The controller 280 is not limited to a dedicated computer and may be configured as a general-purpose computer. For example, the controller 280 according to the present embodiment may be configured by providing an external memory device 282 storing a program as described above, e.g., a magnetic disk (e.g., a magnetic tape, a flexible disk, a hard disk, etc.), an optical disc (e.g., a compact disc (CD), a digital versatile disc (DVD), etc.), a magneto-optical (MO) disc, or a nonvolatile semiconductor memory (e.g., a Universal Serial Bus (USB) memory, a memory card, etc.) and then installing the program in a general-purpose computer using the external memory device 282. However, the means for supplying a program to a computer are not limited to using the external memory device 282. For example, a program may be supplied to a computer using a communication means, e.g., the Internet or an exclusive line, without using the external memory device 282. The memory device 280c or the external memory device 282 may be configured as a non-transitory computer-readable recording medium. Hereinafter, the memory device 280c or the external memory device 282 may also be referred to together simply as a 'recording medium.' When the term 'recording medium' is used in the present disclosure, it may be understood as only the memory device 280c, only the external memory device 282, or both of the memory device 280c and the external memory device 282.

Operation of Substrate Processing Apparatus and Transfer Process

Figure 11:
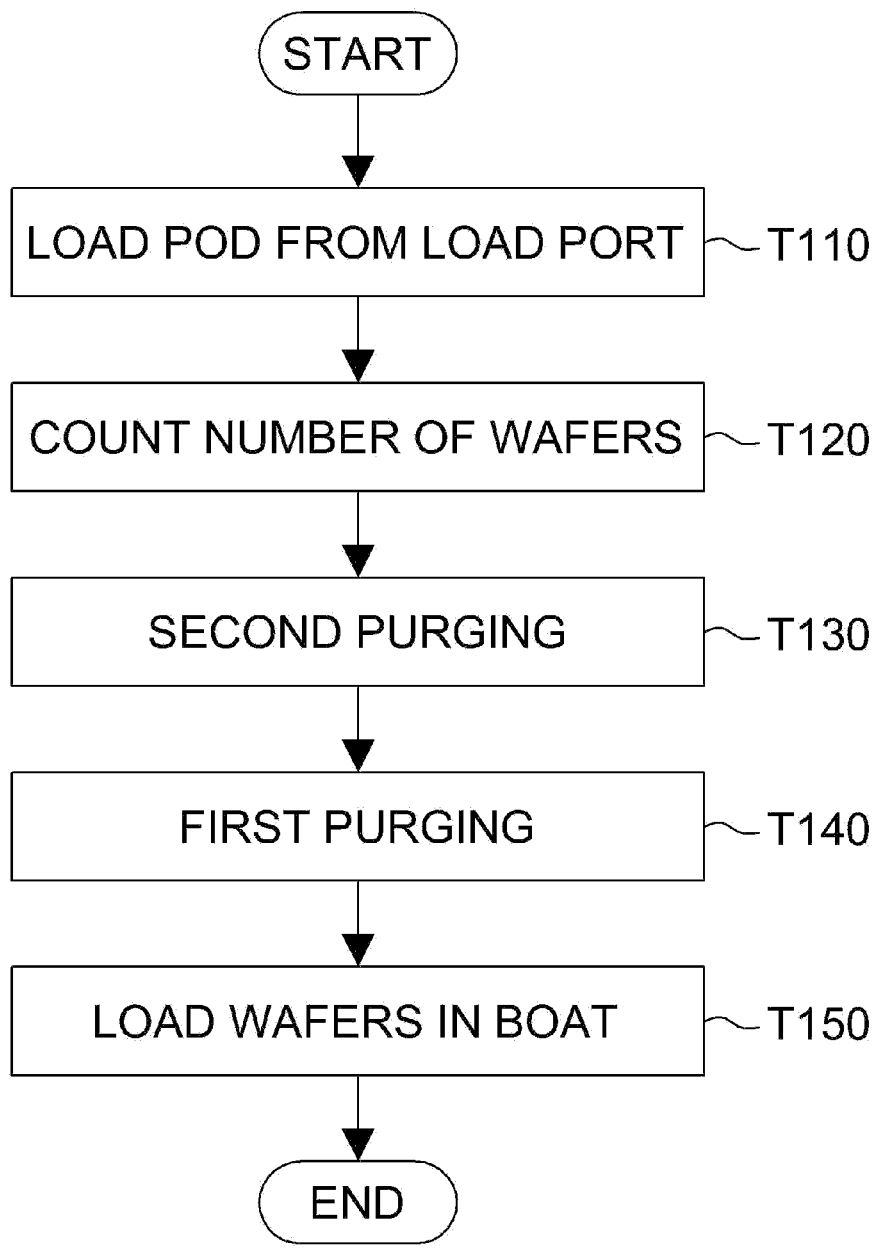
FIG. 11 is a flowchart of a process of loading a substrate container according to an embodiment of the present invention.

Next, an operation of the substrate processing apparatus 100, a substrate container transfer process and a substrate transfer process according to the present embodiment will be described mainly with reference to FIGS. 1, 2 and 11. The substrate container transfer process according to the present embodiment is as illustrated in FIG. 11.

Loading from Loading Port (Operation T110)

As illustrated in FIGS. 1 and 2, when the pod 110 is supplied to the loading port 114, the pod loading/unloading port 112 is opened by the front shutter 113. Then, the pod 110 present on the loading port 114 is loaded into the housing 111 via the pod loading/unloading port 112 by the pod transfer device 118.

Count Number of Wafers (Operation T120)

The pod 110 loaded into the housing 111 is transferred to the pod opener 121 by the pod transfer device 118 and placed on the placing table 122 of the pod opener 121. The wafer loading/unloading ports 120 of the pod opener 121 are closed by the cap attaching/detaching mechanism 123, and the clean air 133 circulates within the transfer chamber 124 to fill the inside of the transfer chamber 124 with the clean air 133. For example, when the inside of the transfer chamber 124 is filled with the clean air 133 such as an inert gas, an oxygen concentration in the transfer chamber 124 is less than or equal to, for example, 20 ppm, and is set to be far less than an oxygen concentration (atmospheric atmosphere) in the housing 111.

The cap of the pod 110 placed on the placing table 122 is removed by the cap attaching/detaching mechanism 123 to open the wafer entrance while an end surface of the pod 10 facing an opening is pressed on the front wall 119a of the sub-housing 119 by marginal portions of the wafer loading/unloading ports 120 facing the opening. Then, the number or states of wafers 200 in the pod 110 are counted or checked by a wafer number counter device (not shown). After the number of the wafers 200 is counted, the cap of the pod 110 is closed by the cap attaching/detaching mechanism 123.

Second Purging (Operation T130)

After the number of the wafers 200 is counted by the wafer number counter device (not shown), the pod 110 is transferred by and placed on the substrate container standby unit 105. Second purging is performed in the pod 110 placed on the substrate container standby unit 105 by the purge ports 1602 such that an oxygen concentration in the pod 110 is in the range of the second management value. Second purging may be continuously performed during the placing of the pod 110 or may be intermittently performed at random time intervals. Also, the transferring of the pod 110 from the loading port 114 to the substrate container standby unit 105 may be repeatedly performed a number of times corresponding to the number of pods 110 that may be placed on the substrate container standby unit 105.

First Purging (Operation T140)

A pod 110 which is a target on which a film is to be formed among a plurality of pods 110 placed on the substrate container standby unit 105 is transferred from the substrate container standby unit 105 to the pod transfer board 118c. First purging is performed in the pod 110 transferred to the pod transfer board 118c by the purge port 1602 installed on the pod transfer board 118c such that an oxygen concentration in the pod 110 is equal to the first management value or less.

Load Wafer in Boat (Operation T150)

The pod 110 on which first purging is performed on the pod transfer board 118c is transferred from the pod transfer board 118c to the pod opener 121, and is then transferred to the placing table 122 of the pod opener 121. The cap of the pod 110 placed on the placing table 122 is removed by the cap attaching/detaching mechanism 123 to open the wafer entrance while the end surface of the pod 110 facing an opening is pressed on the front wall 119a of the sub-housing 119 by marginal portions of the wafer loading/unloading ports 120 facing the opening. In this case, the pod 110 is opened without performing purging as in operation T120. When the pod 110 is opened, the wafer 200 is picked up from the inside of the pod 110 via the wafer entrance by the tweezers 125c of the wafer transfer device 125a and the position of the wafer 200 in a circumferential direction is adjusted by the notch alignment device. Then, the wafer 200 is loaded into the standby unit 126 in the rear of the transfer chamber 124 and is then loaded (charged) in the boat 217. After the wafer 200 is loaded in the boat 217, the wafer transfer device 125a is returned to the pod 110 and a subsequent wafer 200 is loaded in the boat 217.

While the subsequent wafer 200 is loaded in the boat 217 from one of the pod openers 121 (the pod opener 121 on the upper or lower end of the front wall 119a) by the wafer transfer mechanism 125, another pod 110 is additionally transferred and placed on the placing table 122 of the other pod opener 121 (the pod opener 121 on the lower or upper end of the front wall 119a) from the substrate container standby unit 105 which is a rotary type by the pod transfer device 118, and is opened by the pod openers 121 simultaneously with the loading of the subsequent wafer 200. An empty pod 110 is transferred from the pod openers 121 to the substrate container standby unit 105 and placed on the substrate container standby unit 105. Second purging may be performed in the empty pod 110 placed on the substrate container standby unit 105. The loading of the wafer 200 in the boat 217 (operation T150) is performed as described above.

When the boat 217 is loaded (charged) with a predetermined number of wafers 200, the lower end portion of the process container 202 closed by the furnace port shutter 147 is opened. Then, the seal cap 219 is moved upward by the boat elevator 115 to load the boat 217 retaining the predetermined number of wafers 200 in the process container 202 (boat loading).

After the boat loading, a substrate processing process which will be described below is performed in the process container 202. After the substrate processing process, the boat 217 charged with the predetermined number of wafers 200 is unloaded from the inside of the process chamber 201 (boat unloading). After the boat unloading, a substrate unloading process is performed in a flow illustrated in FIG. 12 except for adjusting of the position of the wafer 200 using the notch alignment device.

Substrate Unloading Process

Next, a substrate unloading process will be described with reference to FIG. 12 below.

Transfer Empty Pod (Operation T210)

After the boat unloading, an empty pod 110 is transferred from the substrate container standby unit 105 to the pod opener 121.

Accommodate Wafer in Empty Pod (Operation T220)

After the pod 110 is placed on the pod opener 121, the processed wafer 200 is accommodated in the pod 110. The pod 110 in which the processed wafer 200 is accommodated is transferred again to the substrate container standby unit 105 in an order opposite the order in which the loading of the wafer 200 in the boat 217 (operation T150) is performed. The accommodating of the wafer 200 in the pod 110 and the retransferring of the pod 110 to the substrate container standby unit 105 are repeatedly performed until all of the processed wafers 200 in the boat 217 are accommodated. For example, the accommodating of the wafer 200 in the pod 110 and the retransferring of the pod 110 to the substrate container standby unit 105 are repeatedly performed five times when one hundred wafers 200 may be loaded in the boat 217 and twenty wafers 200 may be accommodated in the pod 110. Also, in this process, second purging may be performed using the pod opener 121 when the processed wafer 200 is accommodated in the pod 110.

Unloading from Loading Port (Operation T230)

After the pod 110 in which the processed wafer 200 is accommodated is retransferred to the substrate container standby unit 105 a predetermined number of times, the pod 110 is transferred from the substrate container standby unit 105 to the loading port 114. The pod 110 transferred to the loading port 114 is unloaded from the loading port 114 to the outside of the housing 111. A process of unloading the pod 110 to the outside of the housing 111 from the substrate container standby unit 105 via the loading port 114 is repeatedly performed a predetermined number of times as described above.

The pod 110 and a substrate are transferred as described above. Also, the transferring of an empty pod (operation T210) to the unloading of a pod from the loading port (operation T230) may be repeatedly performed until all of the pods 110 stored in the substrate container standby unit 105 are unloaded or may be performed until an arbitrary number of the pods 110 are unloaded. Also, after the processed wafer 200 is accommodated in an empty pod 110, the pod 110 may not be transferred again to the substrate container standby unit 105 but may be transferred to the loading port 114 to be unloaded to the outside of the housing 111.

Figure 13A:
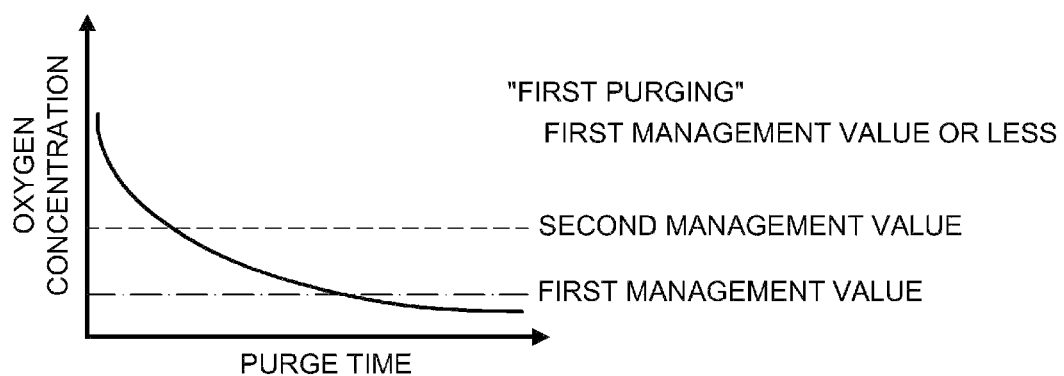
Figure 13B:
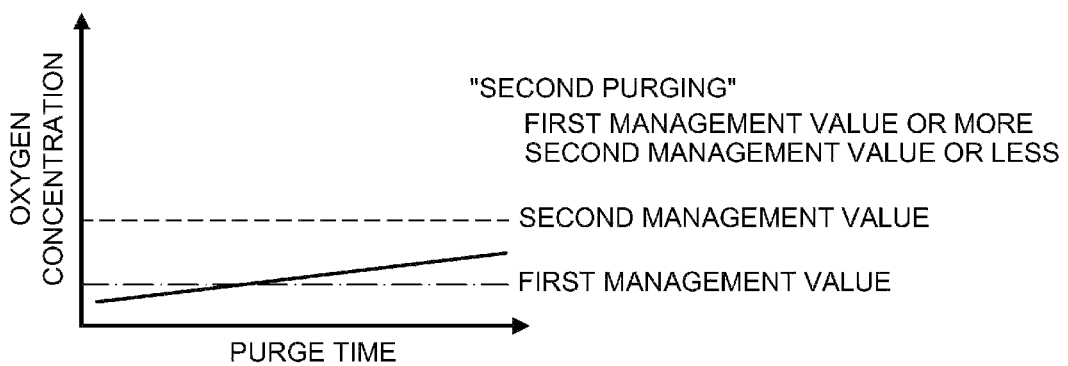

Next, controlling of an oxygen concentration in the pod 110 will be described with reference to FIG. 13 below. FIG. 13A illustrates a variation in an oxygen concentration in a pod when first purging is performed. FIG. 13B illustrates a variation in an oxygen concentration in the pod when second purging is performed. As illustrated in FIG. 13A, first purging is performed such that an oxygen concentration in the pod 110 which is higher than the first management value is adjusted to the first management value or less. As illustrated in FIG. 13B, second purging is performed such that an oxygen concentration in the pod 110 is in a range of the first management value to the second management value.

Substrate Processing Process

Next, a substrate processing process performed as a process of a semiconductor device manufacturing process will be described with reference to FIG. 14. The substrate processing process is performed by the substrate processing apparatus 100 described above. Here, a film-forming process of forming a thin film on the wafer 200 by chemical vapor deposition (CVD) will be described. Also, in the following description, operations of the elements of the substrate processing apparatus 100 are controlled by the controller 280.

Substrate Loading Process (Operation S10)

First, the boat 217 is loaded with a plurality of wafers 200 (wafer charging), lifted by the boat elevator 115, and loaded into the reaction tube 203 (the process chamber 201) (boat loading). In this state, the furnace port which is the lower end of the reaction tube 203 is air-tightly closed by the seal cap 219.

Pressure & Temperature Control Process (Operation S20)

The vacuum pump 234 vacuum-exhausts the inside of the process chamber 201 to a desired pressure (degree of vacuum). In this case, the pressure in the reaction tube 203 is measured by the pressure sensor 232 and the degree of openness of the APC valve 223 is feedback-controlled based on the measured pressure (pressure control). Also, the inside of the process chamber 201 is heated to a desired temperature (e.g., 500° C. to 1,200° C., and preferably, 1,000° C.) by the heater 207. In this case, an amount of electric current supplied to the heater 207 is feedback-controlled based on temperature information detected by the temperature sensor 225 (temperature control).

Also, the boat rotation mechanism 254 is operated to start rotation of the boat 217, i.e., rotation of the wafer 200 while the inside of the process chamber 201 is heated. In this case, the speed of rotating the boat 217 is controlled by the controller 280. The rotation of the boat 217 using the boat rotation mechanism 254 is continuously performed at least until a film-forming process (S30) which will be described below is ended.

Film-Forming Process (Operation S30)

When the inside of the process chamber 201 reaches a desired pressure and temperature, supplying of a process gas into the reaction tube 203 via the process gas supply pipe 221 is started. That is, the valve 224 is opened, and the process gas is supplied into the reaction tube 203 from the process gas source 222 while a flow rate of the process gas is controlled using the MFC 223. The process gas comes in contact with a surface of the wafer 200 while the process gas passes through the process chamber 201, and causes a thermal CVD reaction to occur to deposit a thin film on the surface of the wafer 200. The process gas is exhausted from the vacuum pump 234 by controlling the degree of openness of the APC valve 233 while the process gas is supplied into the reaction tube 203. When a preset process time elapses, the valve 224 is closed to stop the supply of the process gas into the reaction tube 203.

Cooling Process (Operation S40)

After the film-forming process (operation S30) is ended, the supply of power to the heater 207 is stopped and a cooling process (operation S40) is started. In the cooling process (S40), supplying of a cooling medium to a cooling medium flow path 206, discharging of the cooling medium out of the cooling medium flow path 206, etc. are performed.

When temperature of the process container 202 reaches temperature (e.g., 600° C. or less, and preferably, 600° C.) at which the wafer 200 may be unloaded from the inside of the process container 202 (the process chamber 201), the supplying of the cooling medium into the cooling medium flow path 206 is stopped and the cooling process (S40) is ended.

Atmospheric Pressure Recovery & Substrate Unloading Process (S50 and S60)

After the cooling process (operation S40) is ended, the degree of openness of the APC valve 233 is controlled to cause the inner pressure of the process chamber 201 to recover to an atmospheric pressure. Then, the boat 217 is unloaded from the inside of the process chamber 201 in an order opposite the order in which the substrate loading process described above is performed (boat unloading). Then, the processed wafer 200 is unloaded from the boat 217 (wafer discharging) and accommodated into the pod 110, and then the substrate processing process according to the present embodiment is ended.

Effects of the Present Embodiment

According to the present embodiment, one or more of the following effects may be achieved.

(a) According to the present embodiment, the inside of a pod is pre-purged during transfer of the pod, thereby simplifying the gas system and saving costs for components to be used.

(b) According to the present embodiment, pre-purging is performed while the pod is transferred to a pod opener. Thus, a purge time required to open the cap of the pod using the pod opener may be saved, thereby improving the transfer throughput.

(c) According to the present embodiment, an oxygen concentration in the pod 110 may be maintained to have a predetermined management value, and oxygen may be prevented from being adsorbed onto a metal film exposed on a surface of a substrate accommodated in the pod 110 or a natural oxide film may be prevented from being formed, thereby improving a manufacturing quality of a semiconductor device.

(d) According to the present embodiment, the inside of the pod 110 may be purged with an inert gas such that an oxygen concentration in the pod 110 is equal to the first management value during transfer of the pod 110 and is equal to the second management value, for example, while the pod 110 is placed on a substrate container standby unit, thereby reducing an amount of the inert gas to be used.

(e) According to the present embodiment, the number or states of wafers in the pods 110 are checked right after the pods 110 are loaded into the housing 111. Thus, the states of the wafers may be immediately checked and purging of an abnormal pod, e.g., a pod retaining a defective wafer, may be skipped, thereby reducing an amount of the inert gas to be used to perform purging.

(f) According to the present embodiment, an inert gas is supplied into the pod 110 at a first flow rate ranging from 20 slm to 100 slm when first purging is performed. Thus, the inside of the pod 110 may be controlled to be in a low oxygen concentration environment while particles are suppressed from being generated in the pod 110.

(g) According to the present embodiment, an oxygen concentration in the pod 110 may be maintained at a predetermined management value, and a natural oxide film may be suppressed from being locally formed on the wafer 200 even when the wafer 200 has, for example, a diameter of 450 mm. Accordingly, a manufacturing quality of a semiconductor device may be improved.

(h) According to the present embodiment, an oxygen concentration in the pod 110 may be maintained at a predetermined management value and a natural oxide film may be suppressed from being locally formed on the wafer 200 even when a trench having a high aspect ratio is formed on the wafer 200 and thus a surface area of the wafer 200 increases. Accordingly, a manufacturing quality of a semiconductor device may be improved.

(i) According to the present embodiment, first purging is performed to control an oxygen concentration in the pod 110 to be less than or equal to the first management value. Thus, even if the oxygen concentration increases during transferring of the pod 110 to another place from the loading port 114, the oxygen concentration may be prevented from being higher than the first management value or being equal to the second management value or more. Accordingly, a natural oxide film may be suppressed from being formed on the wafer 200.

Another Embodiment of the Present Invention

Although an exemplary embodiment of the present invention has been described above in detail, the present invention is not limited thereto and may be embodied in many different forms without departing from the scope of the present invention.

Figure 15:
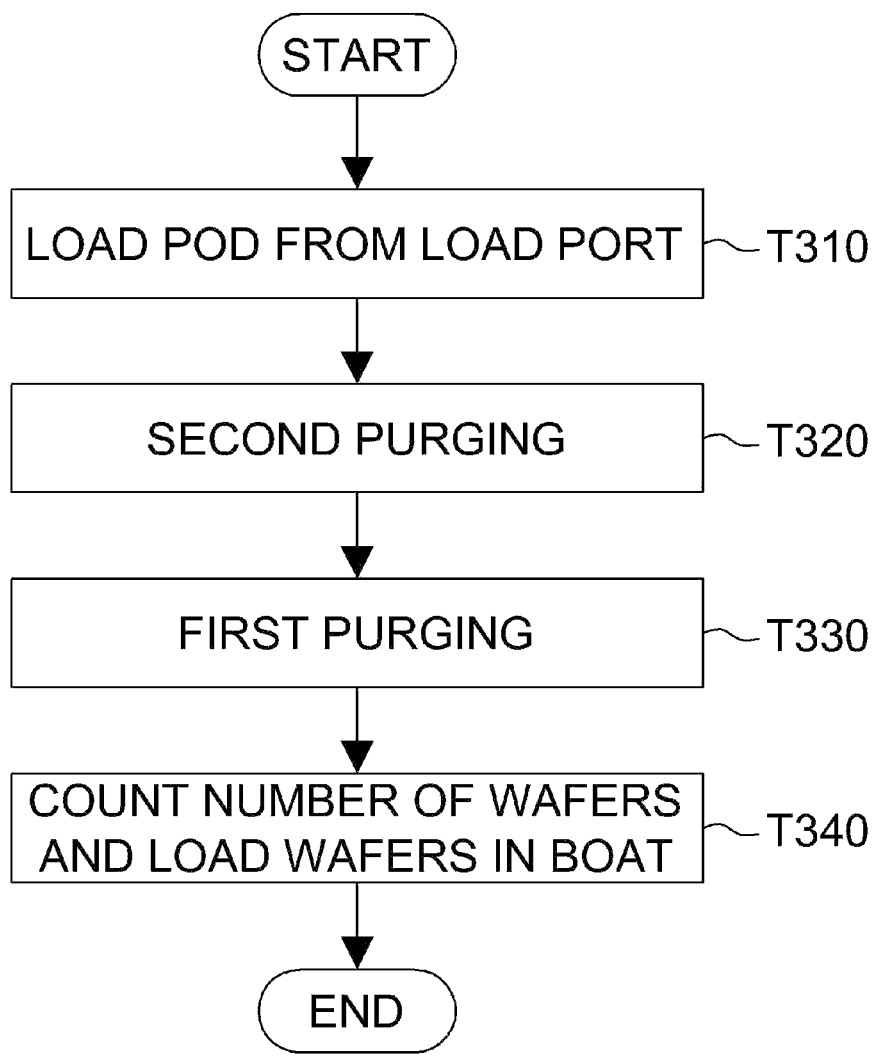
FIG. 15 is a flowchart of a process of transferring a substrate container according to another embodiment of the present invention.

For example, a transfer process may be performed in a flow illustrated in FIG. 15. A transfer process illustrated in FIG. 15 will be described below.

Loading from Loading Port (Operation T310)

When the pod 110 is placed on the loading port 114, the pod loading/unloading port 112 is opened by the front shutter 113. Then, the pod 110 placed on the load port 114 is loaded into the housing 111 via the pod loading/unloading port 112 by the pod transfer device 118.

Second Purging (Operation T320)

The pod 110 loaded from the loading port 114 into the housing 111 is transferred to the substrate container standby unit 105 by the pod transfer device 118. The transferring of the pod 110 is repeatedly performed a number of times corresponding to either the number of the pods 110 that may be placed on the substrate container standby unit 105 or the number of the pods 110 required to perform a substrate processing process. Second purging is performed on the pod 110 placed on the substrate container standby unit 105 as described above. When the pod 110 is placed on the substrate container standby unit 105 for a short time, second purging may be skipped.

First Purging (Operation T330)

The pod 110 placed on the substrate container standby unit 105 is placed on the pod transfer board 118c from the substrate container standby unit 105. First purging is performed on the pod 110 placed on the pod transfer board 118c as described above.

Count Number of Wafers and Load Wafers in Boat (Operation T340)

The pod 110 placed on the pod transfer board 118c and purged such that an oxygen concentration therein is less than or equal to the first management value is transferred to the pod opener 121 by the pod transfer board 118c, and placed on the placing table 122 of the pod opener 121. The cap of the pod 110 placed on the placing table 122 is removed by the cap attaching/detaching mechanism 123 to open the wafer entrance while an end surface of the pod 110 facing an opening is pressed on the front wall 119a of the sub-housing 119 by marginal portions of the wafer loading/unloading port 120 facing the opening. In this case, the pod 110 is opened without being purged unlike in operation T120. When the pod 110 is opened, the number or states of the wafers 200 in the pod 110 are counted or checked by the wafer number counter device (not shown). After the number of the wafers 200 is counted, the wafers 200 are loaded on the boat 217 in an order substantially the same as the order in operation T150 described above. When the loading of the wafers 200 on the boat 217 is completed, boat loading is performed as described above. After the boat loading is performed, the substrate processing process and the substrate unloading process described above are performed.

Effects of the Present Embodiment

According to the present embodiment, one or more of the effects of the previous embodiment may be achieved. Also, one or more of the following effects may be achieved.

(a) According to the present embodiment, all of pods required to perform substrate processing are placed on a substrate container standby unit and are purged on the substrate container standby unit to the first management value or less, and wafers are loaded on a boat using pod openers. Thus, a standby time of the pod transfer device 118 may be reduced to be less than in the previous embodiment, thereby improving the transfer throughput.

(b) According to the present embodiment, the inside of the pod 110 is purged to have the first management value or less, and the counting of the number of wafers and the loading of wafers to the boat (operation T340) are performed using the pod opener 121 Thus, a number of times that the pod 110 is purged on the pod opener 121 to open or close the cap of the pod 110 may be reduced. Also since the purging of the pod 110 on the pod opener 121 may be skipped, a time required to transfer the wafer 200 from the substrate container standby unit to the pod opener 121 may be reduced.

Another Embodiment of the Present Invention

Although another embodiment of the present invention has been described above in detail, the present invention is not limited thereto and may be embodied in many different forms without departing from the scope of the present invention.

Figure 16:
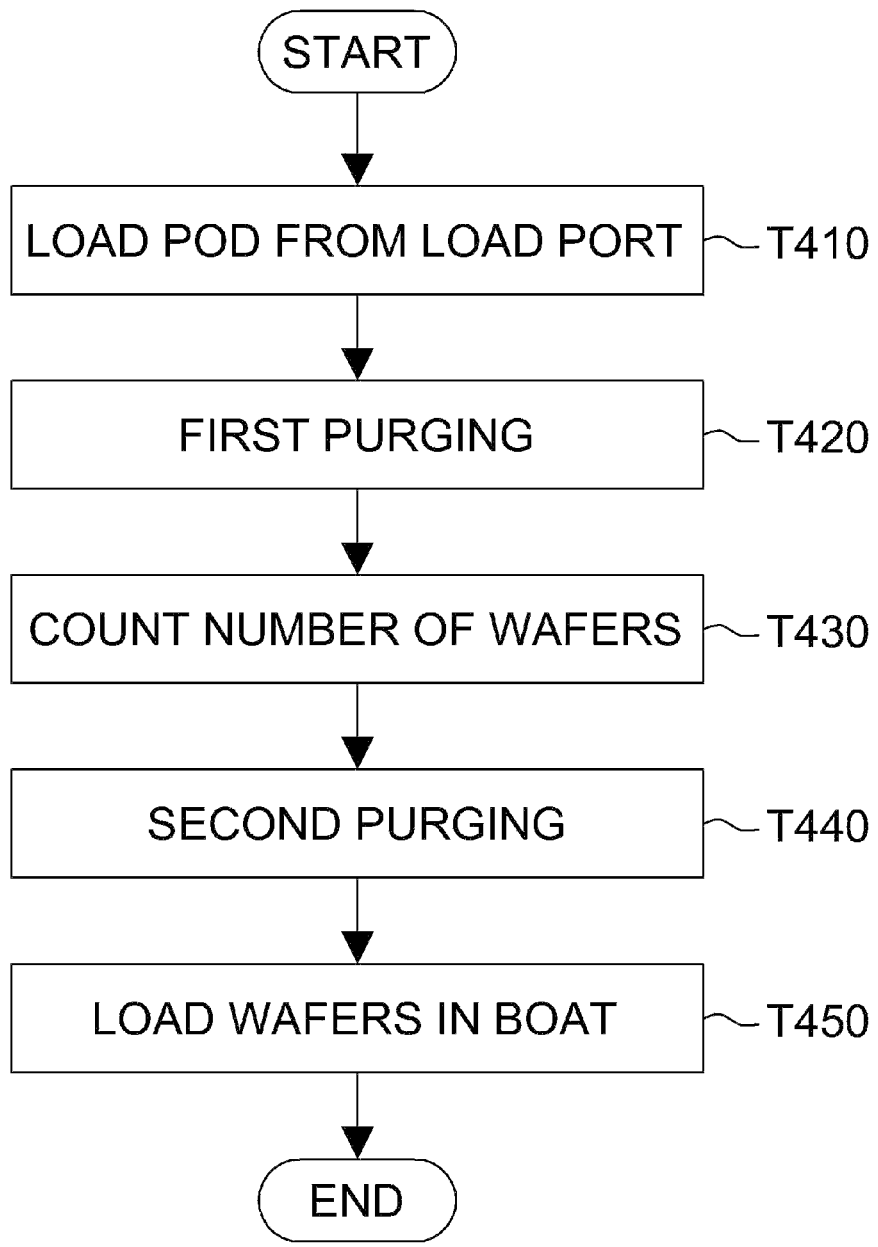
FIG. 16 is a flowchart of a process of transferring a substrate container according to another embodiment of the present invention.

For example, the pod 110 may be transferred in a flow illustrated in FIG. 16. A process of transferring the pod 110 illustrated in FIG. 16 will now be described.

Unloading from Loading Port (Operation T410)

The unloading of a pod from a loading port (operation T410) is performed in a manner similar to that of operation T110.

First Purging (Operation T420)

The pod 110 loaded in the housing 111 is transferred onto the pod transfer board 118c by the pod transfer device 118. First purging is performed on the pod 110 transferred onto the pod transfer board 118c in a manner similar to that in operation T140 described above.

Count Number of Wafers (Operation T430)

The pod 110 purged on the pod transfer board 118c is transferred to the pod opener 121 by the pod transfer board 118c, and placed on the placing table 122 of the pod opener 121. The cap of the pod 110 placed on the placing table 122 is removed by the cap attaching/detaching mechanism 123 to open the wafer entrance while an end surface of the pod 110 facing an opening is pressed on the front wall 119a of the sub-housing 119 by marginal portions of the wafer loading/unloading port 120 facing the opening. In this case, the pod 110 is opened without being purged unlike in operation T120. When the pod 110 is opened, the number or states of the wafers 200 in the pod 110 are counted or checked by the wafer number counter device (not shown).

Second Purging (Operation T440)

After the number or states of the wafers 200 in the pod 110 are checked, the pod 110 is transferred from the pod opener 121 to the substrate container standby unit 105, and second purging is performed on the pod 110 on the substrate container standby unit 105. Second purging may be continuously performed while the pod 110 is placed on the substrate container standby unit 105 or may be intermittently performed.

Load Wafers in Boat (Operation T450)

The pod 110 that stands by on the substrate container standby unit 105 is transferred again to the pod opener 121 and the wafers 200 present in the pod 110 are loaded in the boat 217.

Effects of the Present Embodiment

According to the present embodiment, one or more of the effects of the previous embodiment may be achieved. Also, one or more of the following effects may be achieved.

(a) According to the present embodiment, since the pod 110 is purged on the pod transfer board 118c to have the first management value or less and is then transferred to the pod opener 121, purging performed to open the cap of the pod 110 on the pod opener 121 may be skipped, thereby improving the transfer throughput.

(b) According to the present embodiment, a purge time may be saved when the pod 110 is transferred from the substrate container standby unit 105 to the boat 217 and the counting of the number of wafers 200 may be skipped, thereby reducing a time required to transfer the wafer 200 from the substrate container standby unit 105 to the boat 217.

(c) According to the present embodiment, even if the pod 110 having a high oxygen concentration is loaded from the loading port 114 into the housing 111, first purging may be performed on the pod 110 during the transfer of the pod 110 from the loading port 114 by the pod transfer board 118c to reduce a duration for which the oxygen concentration in the pod 110 is high, thereby suppressing a natural oxide film from being formed.

Another Embodiment of the Present Invention

Although another embodiment of the present invention has been described above in detail, the present invention is not limited thereto and may be embodied in many different forms without departing from the scope of the present invention.

Figure 17:
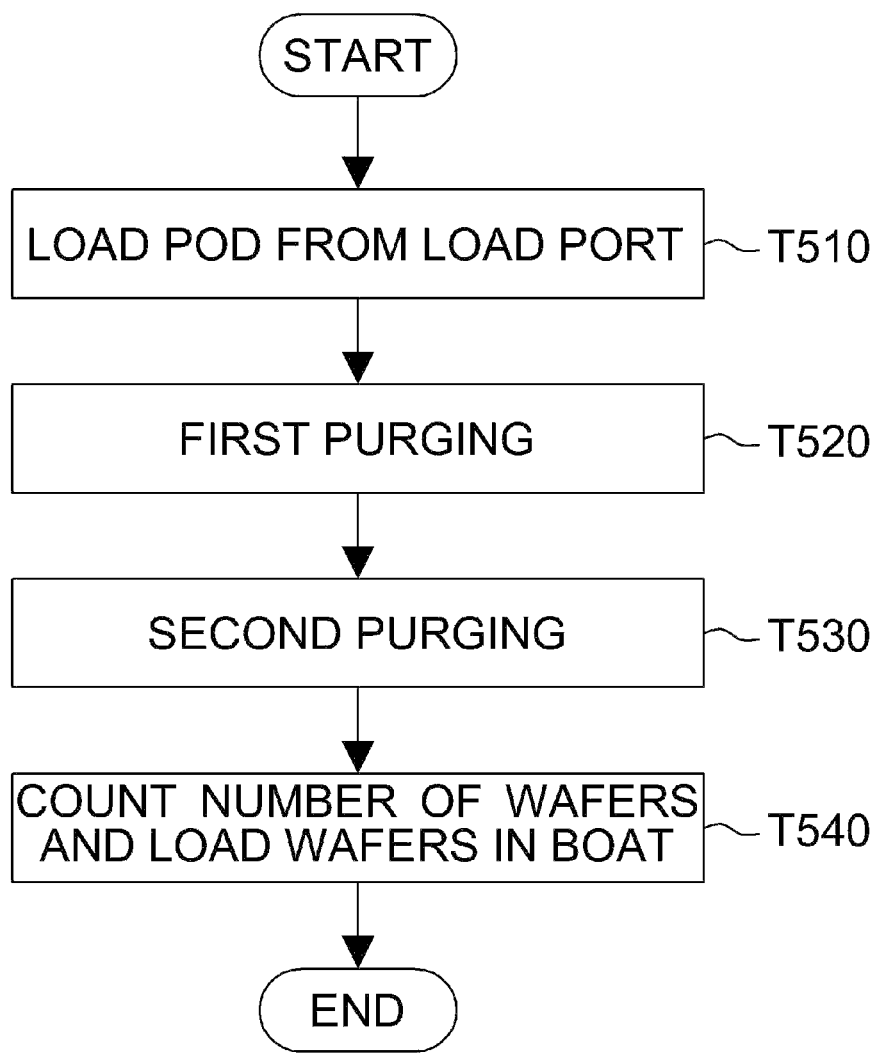
FIG. 17 is a flowchart of a process of transferring a substrate container according to another embodiment of the present invention.

For example, the pod 110 may be transferred in a flow illustrated in FIG. 17. A process of transferring the pod 110 illustrated in FIG. 17 will now be described.

Loading from Loading Port (Operation T510)

The loading of the pod 110 from the loading port 114 (operation T510) is performed in a manner similar to that in operation T110 described above.

First Purging (Operation T520)

First purging (operation T520) is performed in a manner similar to that in operation T420 described above.

Second Purging (Operation T530)

The pod 110 purged on the pod transfer board 118c such that an oxygen concentration in the pod 110 is less than or equal to the first management value is transferred to the substrate container standby unit 105 by the pod transfer board 118*c*. Second purging is performed on the pod 110 placed on the substrate container standby unit 105. Second purging may be continuously performed while the pod 110 stands by on the substrate container standby unit 105 or may be intermittently performed.

Count Number of Wafers and Load Wafers in Boat (Operation T540)

The pod 110 that stands by on the substrate container standby unit 105 is transferred to the pod opener 121. Then, the wafers 200 are transferred from the pod 110 placed on the pod opener 121 to the boat 217 and then substrate processing is performed on the wafers 200 as described above.

Effects of the Present Embodiment

According to the present embodiment, one or more of the effects of the previous embodiment may be achieved.

Another Embodiment of the Present Invention

Although another embodiment of the present invention has been described above in detail, the present invention is not limited thereto and may be embodied in many different forms without departing from the scope of the present invention.

Figure 18:
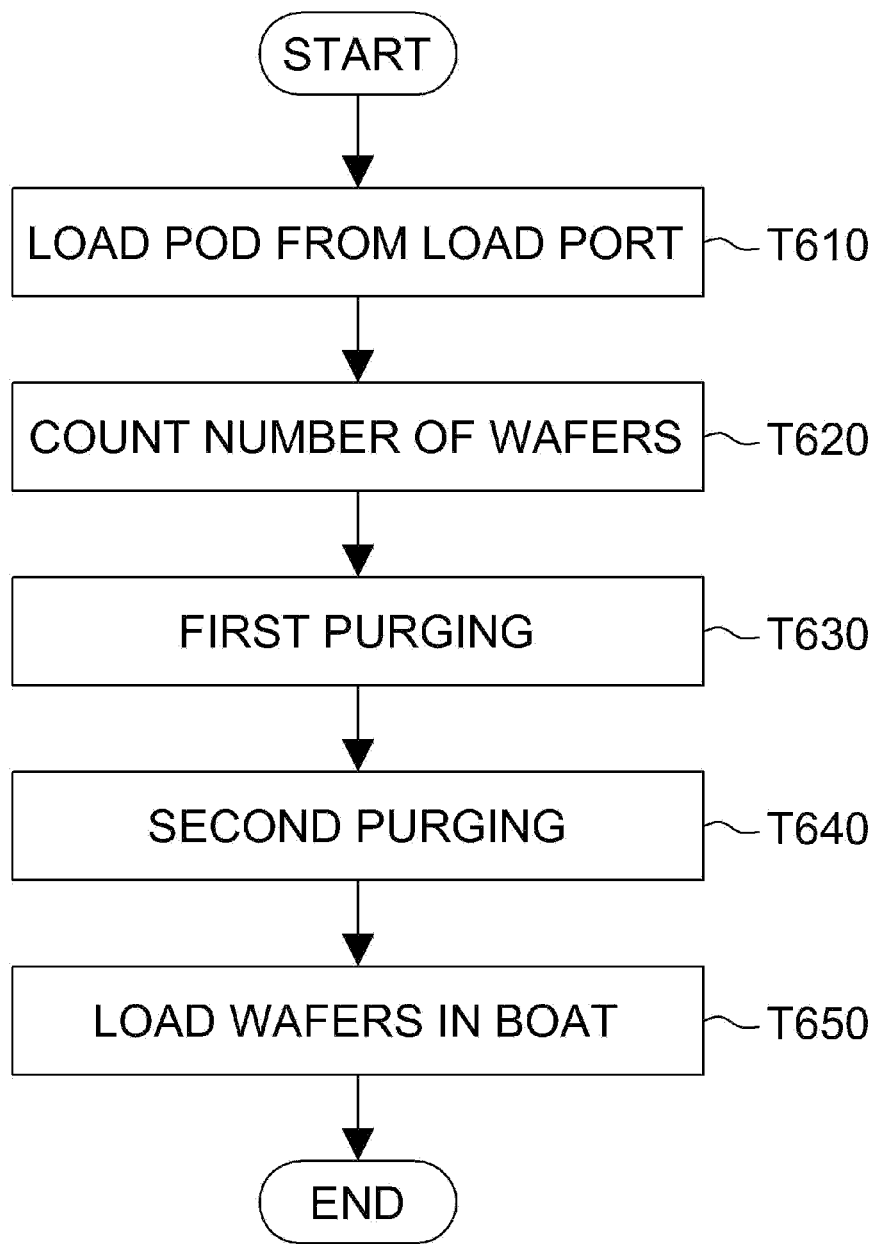
FIG. 18 is a flowchart of a process of transferring a substrate container according to another embodiment of the present invention.

For example, the pod 110 may be transferred in a flow illustrated in FIG. 18. A process of transferring the pod 110 illustrated in FIG. 18 will now be described.

Loading from Loading Port (Operation T610)

The loading of pod from loading port (operation T510) is performed in a manner similar to that in operation T110 described above.

Count Number of Wafers (Operation T620)

Counting of the number of wafers (operation T620) is performed in a manner similar to that in operation T120 described above.

First Purging (Operation T630)

After the number of states of wafers in the pod 110 are checked, the pod 110 is transferred onto the pod transfer board 118*c*. First purging is performed on the pod 110 that is being transferred by the pod transfer board 118*c*.

Second Purging (Operation T640)

The pod 110 purged to have the first management value or less is transferred from the pod transfer board 118*c* to the substrate container standby unit 105, and second purging is performed on the pod 110. Second purging may be continuously performed while the pod 110 is placed on the substrate container standby unit 105 or may be intermittently performed.

Load Wafers in Boat (Operation T650)

The pod 110 that stands by on the substrate container standby unit 105 is transferred again to the pod opener 121 and then the wafers 200 present in the pod 110 are loaded into the boat 217.

Effects of the Present Embodiment

According to the present embodiment, one or more of the effects of the previous embodiment may be achieved.

Another Embodiment of the Present Invention

Although another embodiment of the present invention has been described above in detail, the present invention is not limited thereto and may be embodied in many different forms without departing from the scope of the present invention.

Figure 19:
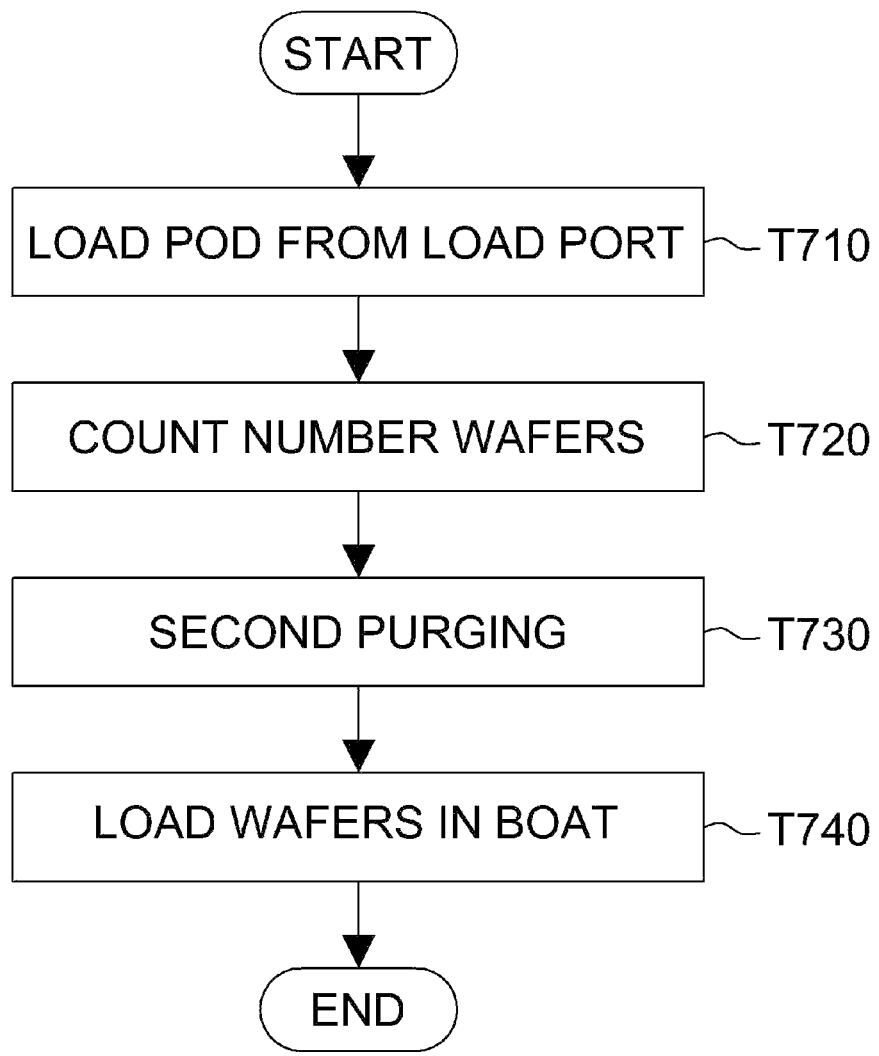
FIG. 19 is a flowchart of a process of transferring a substrate container according to another embodiment of the present invention.

For example, the pod 110 may be transferred in a flow illustrated in FIG. 19. In the flow of FIG. 19, first purging performed in FIG. 18 is skipped. As described above, the pod 110 may be transferred without performing first purging. However, in this case, a time required to purge the pod 110 on the pod opener 121 is longer than a time required to purge the pod 110 on the pod transfer board 118*c* while the pod 110 is transferred. Thus, a process of purging the pod 110 on the pod transfer board 118*c* is preferably performed to control an oxygen concentration in the pod 110 to be less than or equal to the first management value, as in the previous embodiments.

Another Embodiment of the Present Invention

Figure 20:
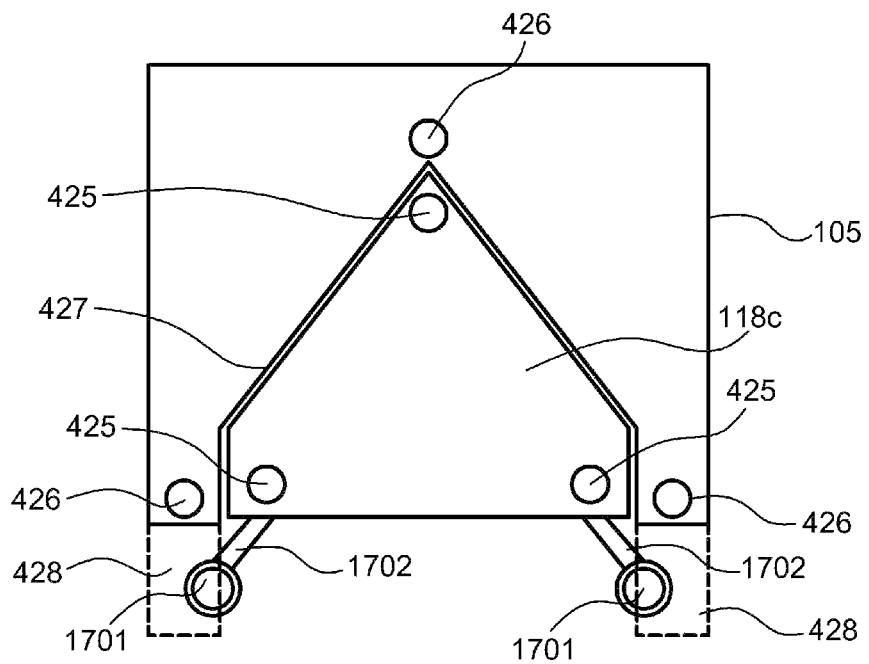
FIG. 20 illustrates a first example of a structure of a substrate container standby unit according to another embodiment of the present invention.
Figure 21:
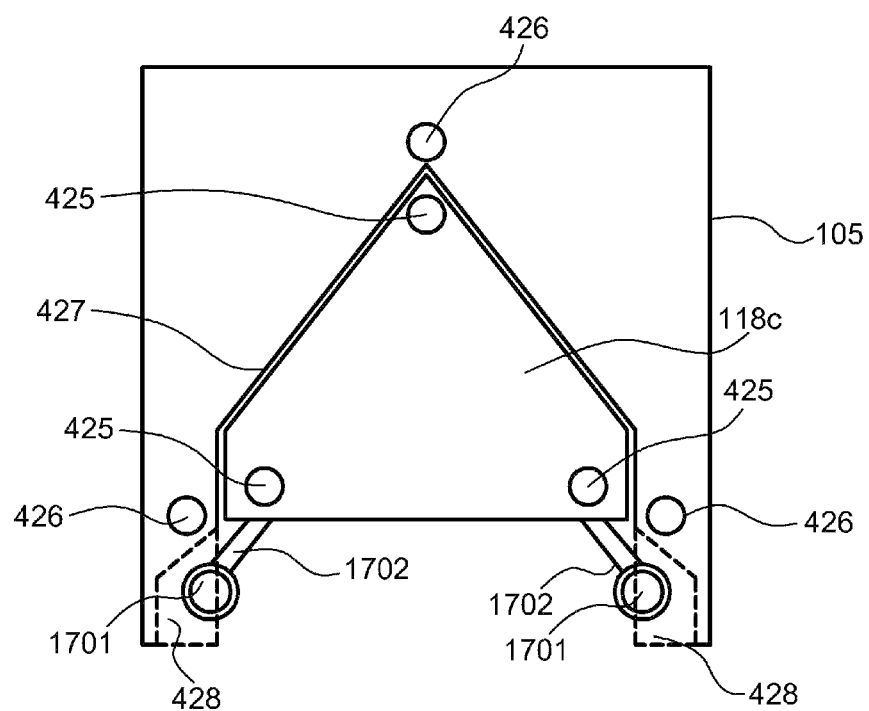
FIG. 21 illustrates a second example of a structure of a substrate container standby unit according to another embodiment of the present invention.
Figure 22:
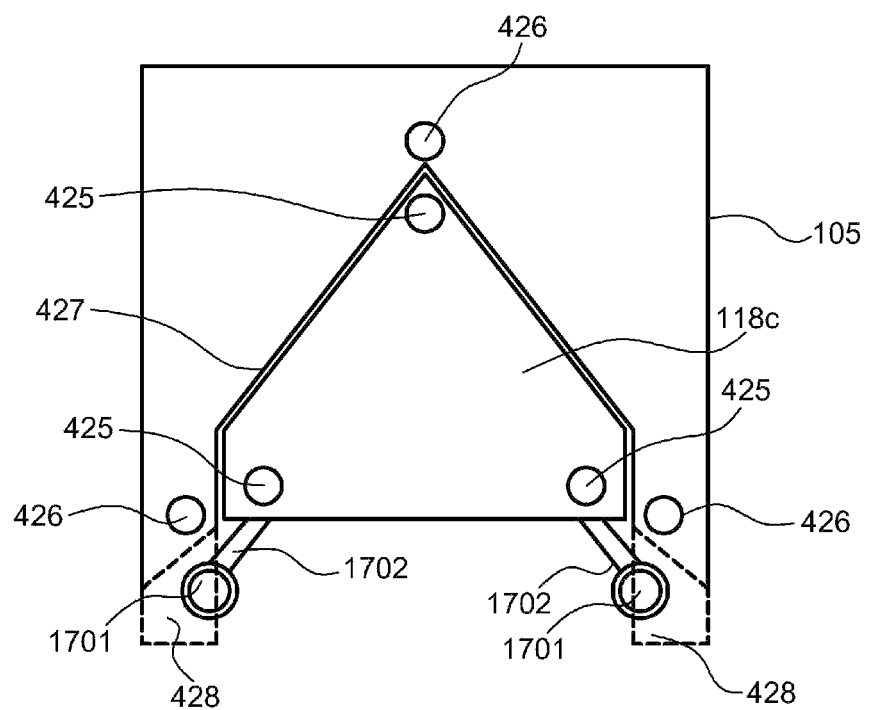
FIG. 22 illustrates a third example of a structure of a substrate container standby unit according to another embodiment of the present invention.

FIG. 20 illustrates a first example of a structure of a substrate container standby unit according to another embodiment of the present invention. Contact preventing units 428 of a substrate container standby unit 105 will be described with reference to FIG. 20 below. FIG. 20 illustrates a state in which the pod transfer board 118*c* approaches the pod 110 placed on the substrate container standby unit 105. Here, the pod 110 placed on the substrate container standby unit 105 is omitted. Kinematic pins 426, a pod accommodation unit 427 and the contact preventing units 428 are installed on substrate container standby unit 105. The kinematic pins 425, purge gas supply units 1701 configured to introduce a purge gas and the evacuation mechanism 1702 configured to withdraw the purge gas supply units 1701 are installed on the pod transfer board 118*c*. When the pod transfer board 118*c* approaches the pod 110 from the bottom of the substrate container standby unit 105, a portion of the substrate container standby unit 105 may be interfered with the pod transfer board 118*c*. To avoid the interference, the contact preventing units 428 are formed on the substrate container standby unit 105. FIG. 21 illustrates a second example of a structure of a substrate container standby unit according to another embodiment of the present invention. FIG. 22 illustrates a third example of a structure of a substrate container standby unit according to another embodiment of the present invention. As illustrated in FIG. 21 and FIG. 22, the shapes of the contact preventing units 428 are not limited, provided that the purge gas supply units 1701 of the pod transfer board 118*c* are not interfered with the contact preventing units 428. When the contact preventing units 428 are installed on the substrate container standby unit 105, a placing unit of the substrate container standby unit 105 and purging units 428 may be suppressed from being interfered with each other.

Although only an oxygen concentration in the pod 110 is controlled in the present invention, humidity in the pod 110 may be controlled. In detail, purging is performed such that the humidity in the pod 110 is less than or equal to a relative humidity of 5%. The humidity in the pod 110 may be controlled by detecting humidity in the pod 110 or in an exhaust gas using the dew-point meter 424 or 524 described above and feedback-controlling the humidity in the pod 110 based on the detected humidity. Also, the relationship between a feed rate and duration of an inert gas and the humidity in the pod 110 may be detected beforehand, and the humidity in the pod 110 may be set to vary according to the feed rate and duration of the inert gas.

Although a case in which the pod transfer board 118*c* is used as a first purge unit has been described above, the present invention is not limited thereto. The pod opener 121 or the loading port 114 may be set to include the functions of the pod transfer board 118*c* so that the pod opener 121 or the loading port 114 may act as the first purge unit. Also, the first purge unit may be installed on a plurality of locations.

Also, although first purging and second purging are performed at different locations in the present invention, the present invention is not limited thereto and first purging and second purging may be sequentially performed at the same location.

The present invention is also applicable to forming various films (such as an oxide film, a nitride film, a metal film, etc.) by CVD, atomic layer deposition (ALD), physical vapor deposition (PVD), or the like. The present invention is also applicable to substrate processing performed by plasma treatment, diffusion, annealing, oxidizing, nitriding, lithography, etc. In addition to a thin film forming apparatus, the present invention is also applicable to another substrate processing apparatus, e.g., an etching apparatus, an annealing treatment apparatus, an oxidizing apparatus, a nitriding apparatus, an exposure apparatus, an application apparatus, a molding apparatus, a developing apparatus, a dicing apparatus, a wire bonding apparatus, a drying apparatus, a heating apparatus, an inspection apparatus, etc. Also, the present invention is not limited to the substrate processing apparatus 100 which is a vertical type, and is also applicable to various substrate processing apparatuses such as a horizontal substrate processing apparatus or a single-wafer type substrate processing apparatus.

Also, the present invention is not limited to a semiconductor manufacturing apparatus for processing a semiconductor wafer, such as the substrate processing apparatus 100 according to the present embodiment, and is applicable to a liquid crystal display (LCD) manufacturing apparatus for processing a glass substrate, a substrate processing apparatus such as a solar cell manufacturing apparatus, etc.

With a substrate processing apparatus, a method of manufacturing a semiconductor device and a non-transitory computer-readable recording medium according to the present invention, the manufacturing throughput of a semiconductor device may be increased while improving the quality and characteristics of the semiconductor device.

Exemplary Embodiments of the Present Invention

Hereinafter, exemplary embodiments according to the present invention are supplementarily noted.

Supplementary Note 1

According to an aspect of the present invention, there is provided a substrate processing apparatus including: a process chamber configured to process a substrate; a purge unit configured to transfer a substrate container accommodating the substrate and purge an inside of the substrate container; a substrate container standby unit configured to accommodate the substrate container; a contact preventing unit installed at the substrate container standby unit and configured to prevent a contact between the purge unit and the substrate container standby unit when the substrate container is transferred to the substrate container standby unit; and a control unit configured to control the substrate container transfer device.

Supplementary Note 2

In the apparatus of Supplementary note 1, preferably, the purge unit includes a purge gas supply unit configured to supply a purge gas into the substrate container.

Supplementary Note 3

In the apparatus of any one of Supplementary notes 1 and 2, preferably, the purge unit includes a gas exhaust unit configured to exhaust an atmosphere in the substrate container.

Supplementary Note 4

In the apparatus of any one of Supplementary notes 1 through 3, preferably, the control unit is configured to control the purge unit so as to purge the inside of the substrate container.

Supplementary Note 5

In the apparatus of Supplementary note 4, preferably, the control unit is configured to control the purge unit so as to purge the inside of the substrate container when the substrate container is being transferred from a substrate container stage (loading port) to the substrate container standby unit.

Supplementary Note 6

In the apparatus of any one of Supplementary notes 4 and 5, preferably, the control unit is configured to control the purge unit so as to purge the inside of the substrate container when the substrate container is being transferred from the substrate container standby unit to a substrate container opener.

Supplementary Note 7

In the apparatus of any one of Supplementary notes 4 through 6, preferably, the control unit is configured to control the purge unit so as to purge the inside of the substrate container when the substrate container is being placed on the substrate container standby unit.

Supplementary Note 8

In the apparatus of any one of Supplementary notes 4 through 7, preferably, the control unit is configured to control the purge unit so as to purge the inside of the substrate container when the substrate container is being transferred from a substrate container stage (loading port) to a substrate container opener.

Supplementary Note 9

In the apparatus of any one of Supplementary notes 1 through 8, preferably, a metal film is formed on the substrate.

Supplementary Note 10

In the apparatus of any one of Supplementary notes 1 through 9, preferably, a purge gas supply unit configured to supply a purge gas into the substrate container is only installed at the purge unit.

Supplementary Note 11

In the apparatus of any one of Supplementary notes 4 through 8, preferably, the control unit is configured to control the purge unit so as to purge the inside of the substrate container before opening or closing a lid of the substrate container.

Supplementary Note 12

According to another aspect of the present invention, there is provided a method of manufacturing a semiconductor device including: (a) transferring a substrate container from a substrate container storage chamber where the substrate container is stored to a substrate container opener by a substrate container transfer device; (b) transferring a substrate accommodated in the substrate container from the substrate container opener to a substrate storage chamber; (c) transferring the substrate from the substrate storage chamber to a process container; and (d) placing the substrate container on a substrate container standby unit, and further including purging an inside of the substrate container using a purging unit installed in the substrate container transfer device before performing (a) wherein a contact preventing unit is installed at a position corresponding to a position of the purging unit of the substrate container standby unit.

Supplementary Note 13

In the method of Supplementary note 12, preferably, an oxygen concentration in the substrate container when the substrate container is placed on the substrate container standby unit is higher than that of the substrate container when the substrate container is being transferred by the substrate container transfer device.

Supplementary Note 14

According to still another aspect of the present invention, there is provided a program for causing a computer to perform: (a) transferring a substrate container from a substrate container storage chamber where the substrate container is stored to a substrate container opener by a substrate container transfer device; (b) transferring a substrate accommodated in the substrate container from the substrate container opener to a substrate storage chamber; (c) transferring the substrate from the substrate storage chamber to a process container; and (d) placing the substrate container on a substrate container standby unit, and further perform purging an inside of the substrate container using a purging unit installed in the substrate container transfer device before performing (a) wherein a contact preventing unit is installed at a position corresponding to a position of the purging unit of the substrate container standby unit.

Supplementary Note 15

According to still another aspect of the present invention, there is provided a non-transitory computer-readable recording medium storing a program for causing a computer to perform: (a) transferring a substrate container from a substrate container storage chamber where the substrate container is stored to a substrate container opener by a substrate container transfer device; (b) transferring a substrate accommodated in the substrate container from the substrate container opener to a substrate storage chamber; (c) transferring the substrate from the substrate storage chamber to a process container; and (d) placing the substrate container on a substrate container standby unit, and further perform purging an inside of the substrate container using a purging unit installed in the substrate container transfer device before performing (a) wherein a contact preventing unit is installed at a position corresponding to a position of the purging unit of the substrate container standby unit.

Supplementary Note 16

According to still another aspect of the present invention, there is provided a substrate processing apparatus including a process container configured to process a substrate; a transfer chamber connected to the process container and configured as a transfer space of the substrate; a substrate container transfer device configured to transfer a substrate container accommodating the substrate; a first purge unit installed on the substrate container transfer device; a substrate container standby unit configured to place the substrate container thereon; a second purge unit installed on the substrate container standby unit; an evacuation mechanism configured to withdraw the second purge unit; and a control unit configured to control one of the substrate container transfer device, the first purge unit and the second purge unit, the substrate container standby unit and the evacuation mechanism so as to withdraw the first purge unit or second purge unit when the substrate container is transferred to the substrate container standby unit.

Accordingly, a manufacturing quality and throughput of a semiconductor device may be improved.

What is claimed is:

1. A substrate processing apparatus comprising:
a substrate container transfer device configured to transfer a substrate container accommodating a substrate and purge an inside of the substrate container;
a purge gas supply unit installed at the substrate container transfer device and configured to supply a purge gas into the substrate container;
a substrate container standby unit configured to accommodate the substrate container;
a contact preventing unit installed at the substrate container standby unit and configured to prevent a contact between the purge gas supply unit and the substrate container standby unit when the substrate container is transferred to the substrate container standby unit by the substrate container transfer device; and
a control unit configured to control the substrate container transfer device and the purge gas supply unit so as to purge an inside of the substrate container when the substrate container is being transferred.

2. The apparatus of claim 1, further comprising a second purge gas supply unit installed at the substrate container standby unit and configured to supply the purge gas into the substrate container.

3. The apparatus of claim 1, further comprising:
a loading port configured to receive the substrate container; and
a pod opener configured to open/close the substrate container;
wherein the substrate container transfer device is configured to move in the vertical and horizontal directions and transfer the substrate container among the loading port, the substrate container standby unit and the pod opener.

4. The apparatus of claim 3, further comprising:
a second purge gas supply unit installed at the pod opener and configured to supply the purge gas into the substrate container when a processed substrate is accommodated in the substrate container.

5. A substrate processing apparatus comprising:
a substrate container transfer device configured to transfer a substrate container accommodating a substrate and purge an inside of the substrate container;
a purge gas supply unit installed at the substrate container transfer device and configured to supply a purge gas into the substrate container;
a second purge gas supply unit installed at the substrate container standby unit and configured to supply the purge gas into the substrate container;
a substrate container standby unit configured to accommodate the substrate container;
a contact preventing unit installed at the substrate container standby unit and configured to prevent a contact between the purge gas supply unit and the substrate container standby unit when the substrate container is transferred to the substrate container standby unit by the substrate container transfer device; and
a control unit configured to control the substrate container transfer device and the purge gas supply unit,
wherein the control unit is further configured to control the purge gas supply unit and the second purge gas supply unit in a manner that an oxygen concentration in the substrate container when the substrate container is placed on the substrate container standby unit is higher than that of the substrate container when the substrate container is being transferred by the substrate container transfer device.

6. The apparatus of claim 5, wherein the control unit is configured to control the substrate container transfer device and the purge gas supply unit so as to purge the inside of the substrate container when the substrate container is being transferred.

7. A substrate processing apparatus comprising:
a substrate container transfer device configured to transfer a substrate container accommodating a substrate and purge an inside of the substrate container;
a purge gas supply unit installed at the substrate container transfer device and configured to supply a purge gas into the substrate container;
a second purge gas supply unit installed at the substrate container standby unit and configured to supply the purge gas into the substrate container;
a substrate container standby unit configured to accommodate the substrate container;

a contact preventing unit installed at the substrate container standby unit and configured to prevent a contact between the purge gas supply unit and the substrate container standby unit when the substrate container is transferred to the substrate container standby unit by the substrate container transfer device; and a control unit configured to control the substrate container transfer device and the purge gas supply unit.

* * * * *